(12) United States Patent
Specht et al.

(10) Patent No.: US 7,714,377 B2
(45) Date of Patent: May 11, 2010

(54) INTEGRATED CIRCUITS AND METHODS OF MANUFACTURING THEREOF

(75) Inventors: Michael Specht, Munich (DE); Nicolas Nagel, Dresden (DE); Franz Hofmann, Munich (DE); Thomas Mikolajick, Dresden (DE)

(73) Assignees: Qimonda AG, Munich (DE); Qimonda Flash GmbH, Dresden (DE)

( * ) Notice: Subject to any disclaimer, the term of this patent is extended or adjusted under 35 U.S.C. 154(b) by 489 days.

(21) Appl. No.: 11/737,617

(22) Filed: Apr. 19, 2007

(65) Prior Publication Data

US 2008/0259687 A1    Oct. 23, 2008

(51) Int. Cl.
*H01L 29/788* (2006.01)
(52) U.S. Cl. ...................... 257/316; 257/324
(58) Field of Classification Search ......... 257/315–317, 257/321, 324
See application file for complete search history.

(56) References Cited

U.S. PATENT DOCUMENTS

| | | | |
|---|---|---|---|
| 2004/0206996 A1 | 10/2004 | Lee et al. | |
| 2005/0133916 A1 | 6/2005 | Karnezos | |
| 2007/0018201 A1 | 1/2007 | Specht et al. | |
| 2008/0258203 A1* | 10/2008 | Happ et al. | ............... 257/324 |

OTHER PUBLICATIONS

Lee, Y.K., et al., "Multi-Level Vertical Channel SONOS Nonvolatile Memory on SOI," IEEE, Symposium on VLSI Technology Digest of Technical Papers, 2002, 2 pages.

* cited by examiner

*Primary Examiner*—Thien F Tran
(74) *Attorney, Agent, or Firm*—Slater & Matsil, L.L.P.

(57) ABSTRACT

Embodiments of the invention relate to integrated circuits having a memory cell arrangement and methods of manufacturing thereof. In one embodiment of the invention, an integrated circuit has a memory cell arrangement which includes a fin structure extending in its longitudinal direction as a first direction, including a first insulating layer, a first active region disposed above the first insulating layer, a second insulating layer disposed above the first active region, a second active region disposed above the second insulating layer, a charge storage layer structure disposed at least next to at least one sidewall of the fin structure covering at least a portion of the first active region and at least a portion of the second active region, and a control gate disposed next to the charge storage layer structure.

35 Claims, 15 Drawing Sheets

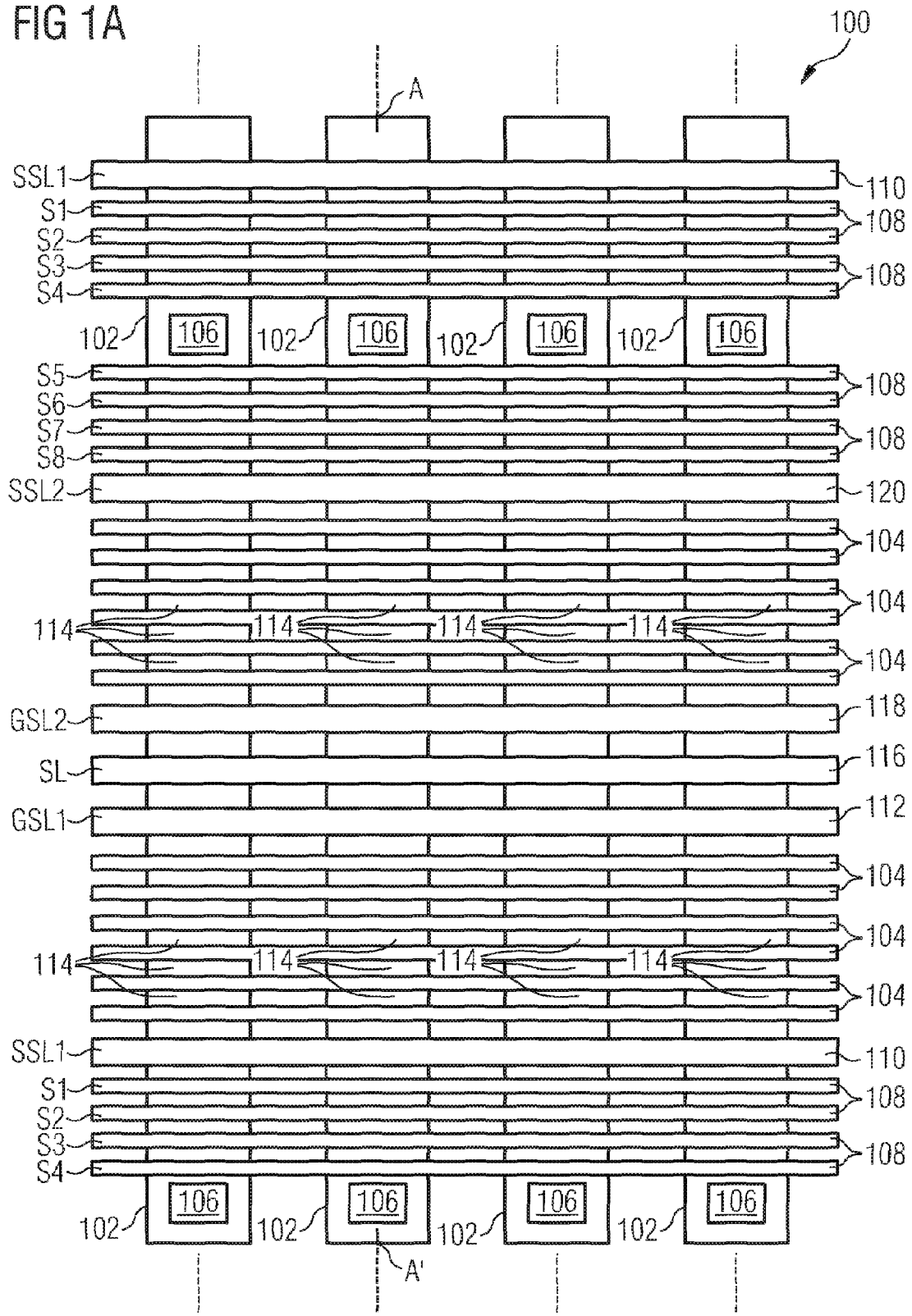

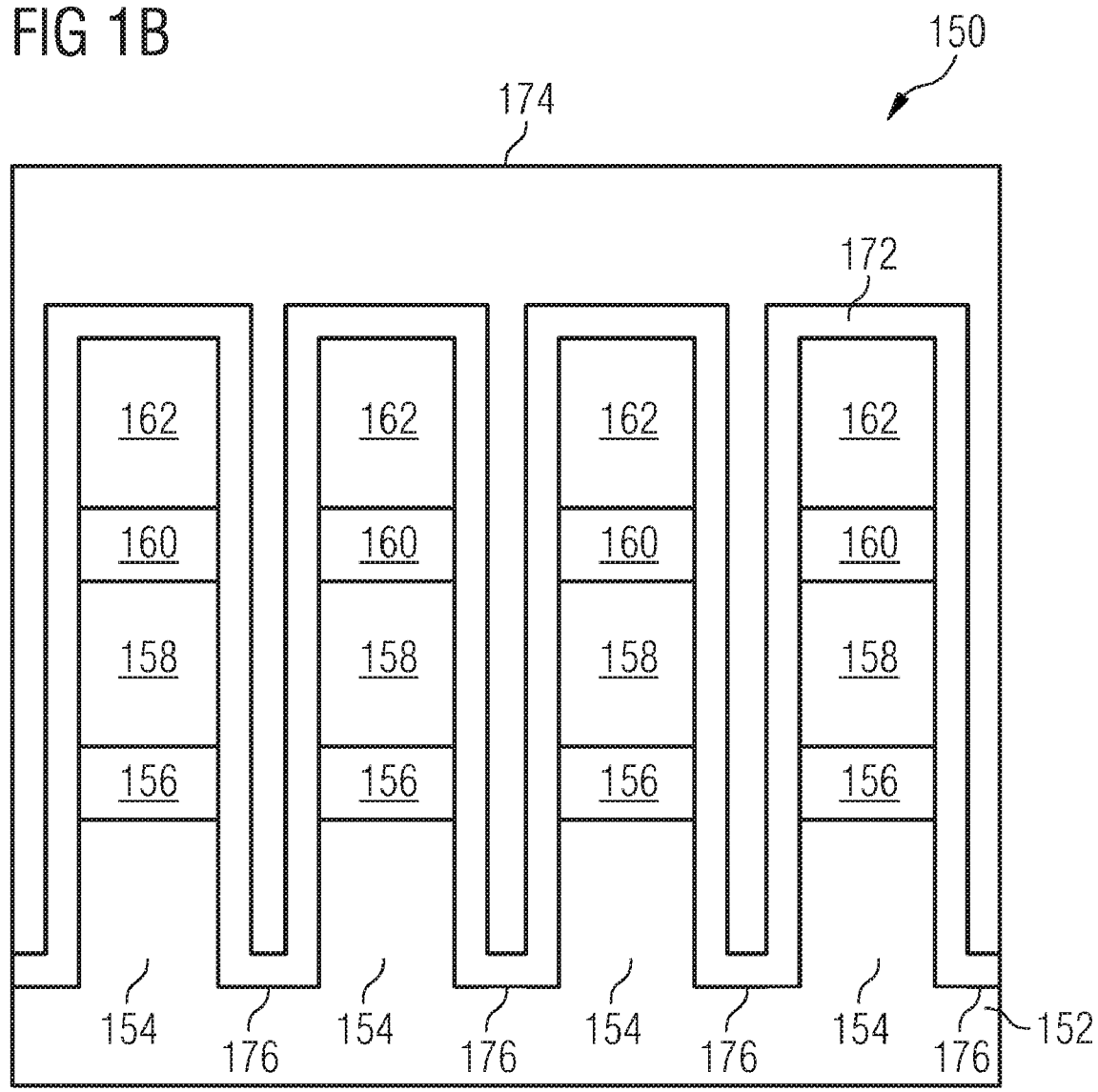

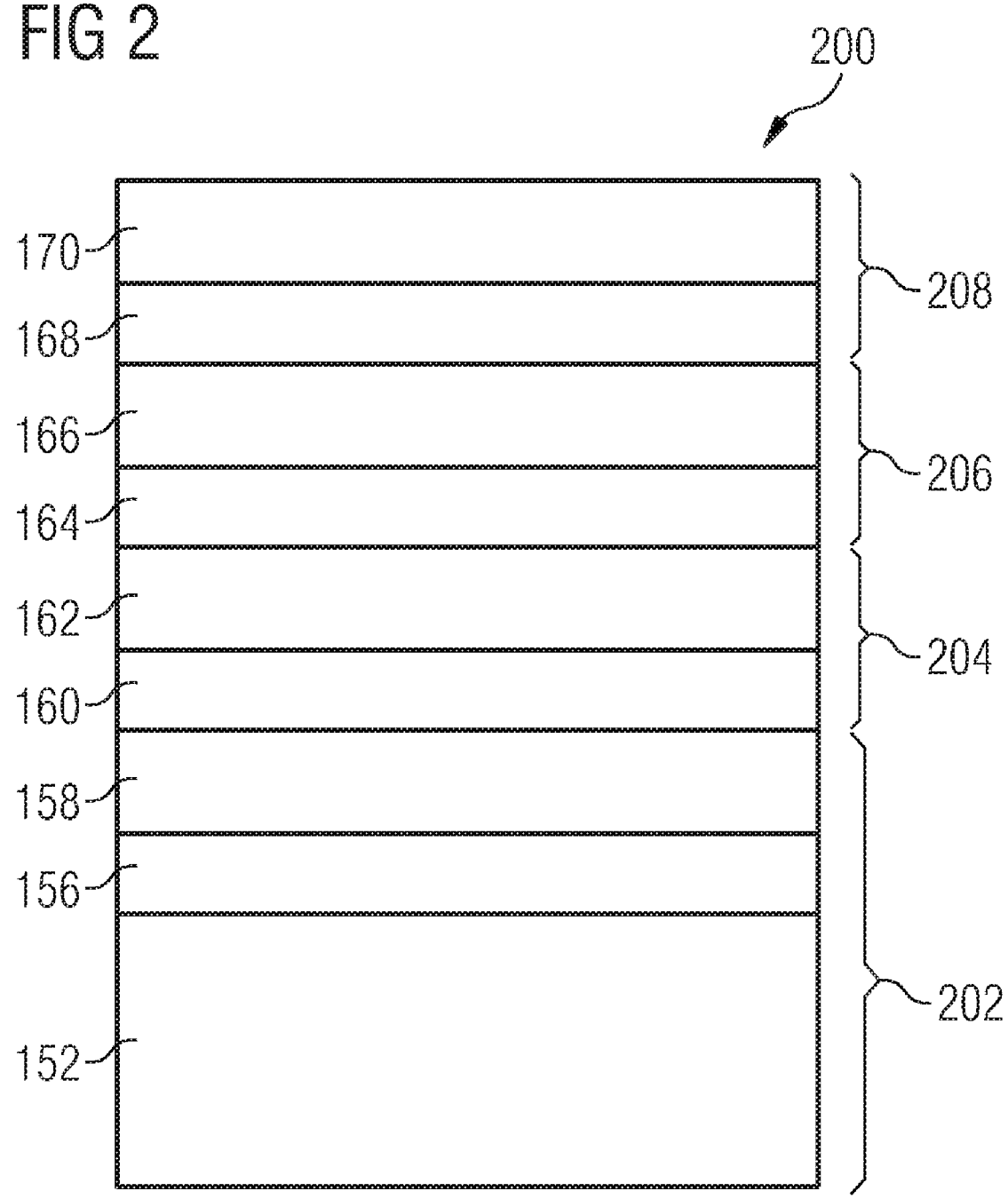

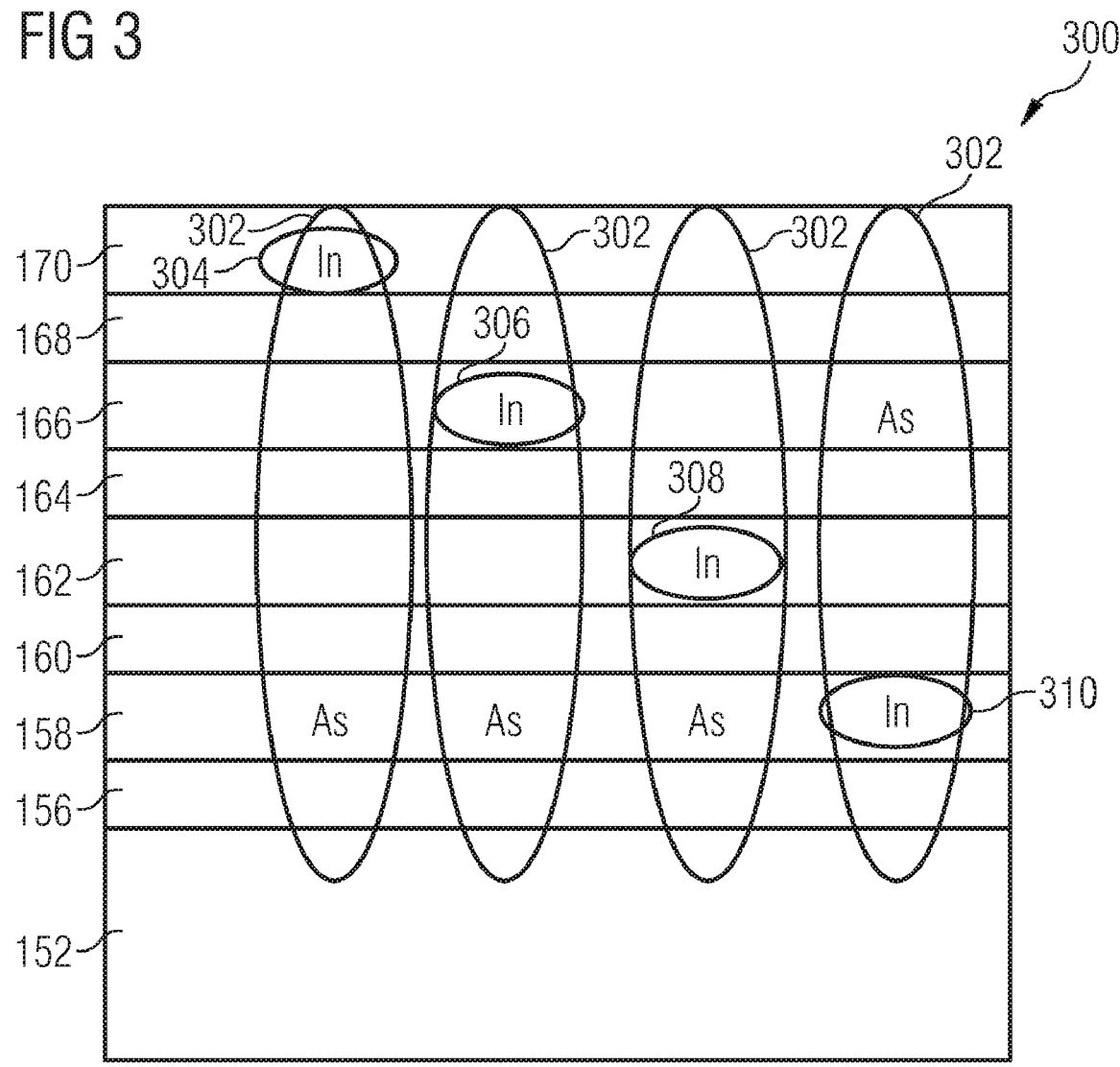

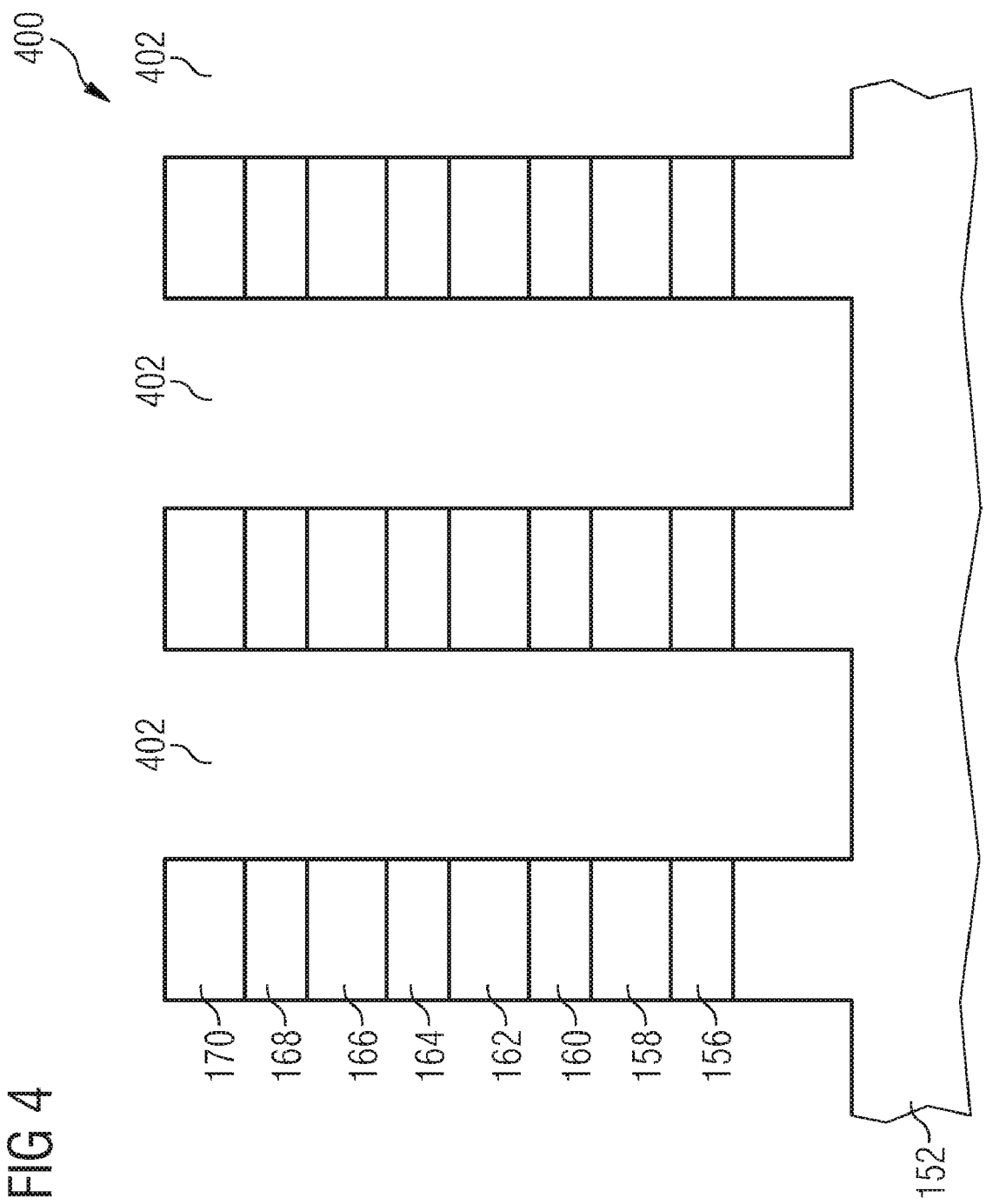

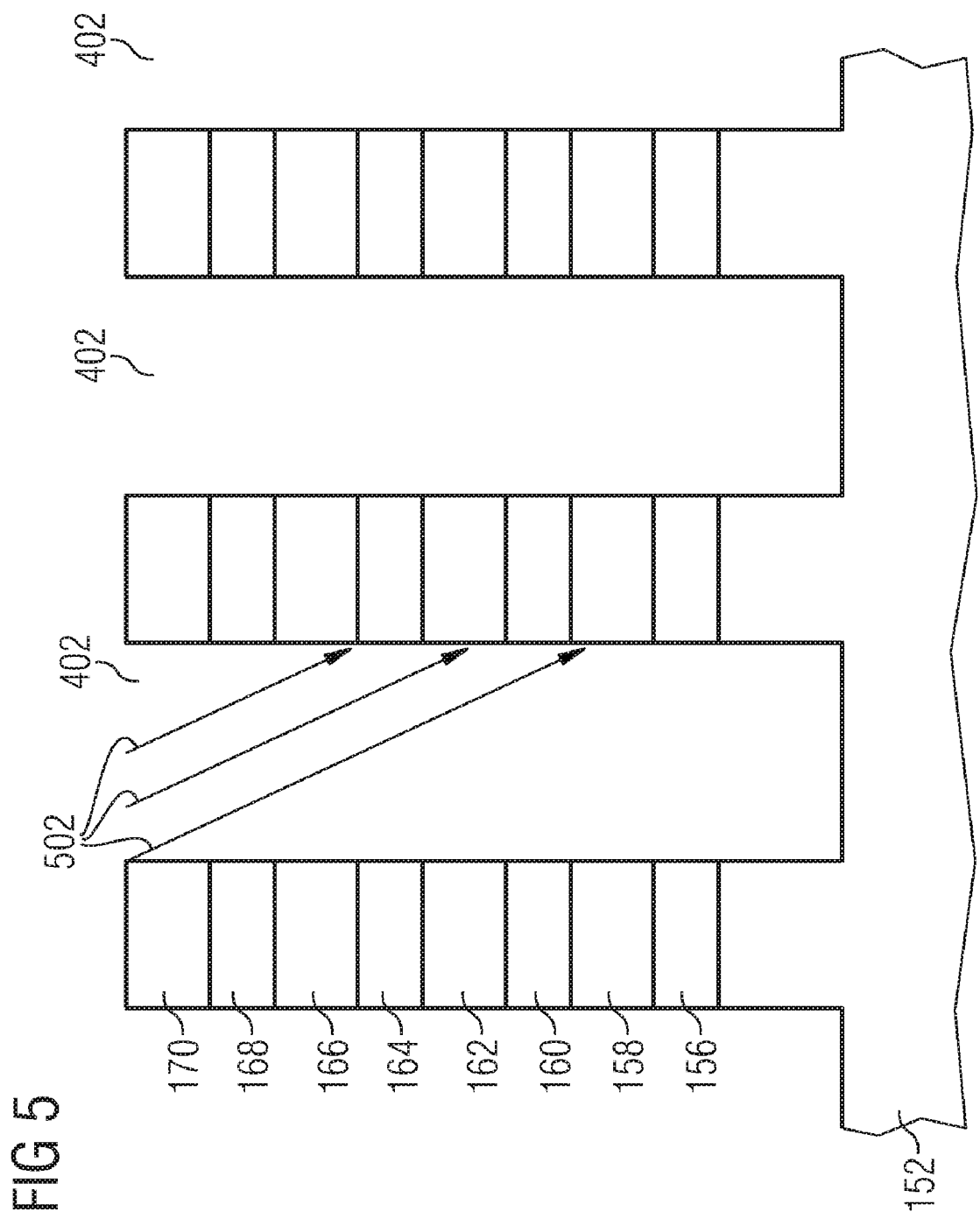

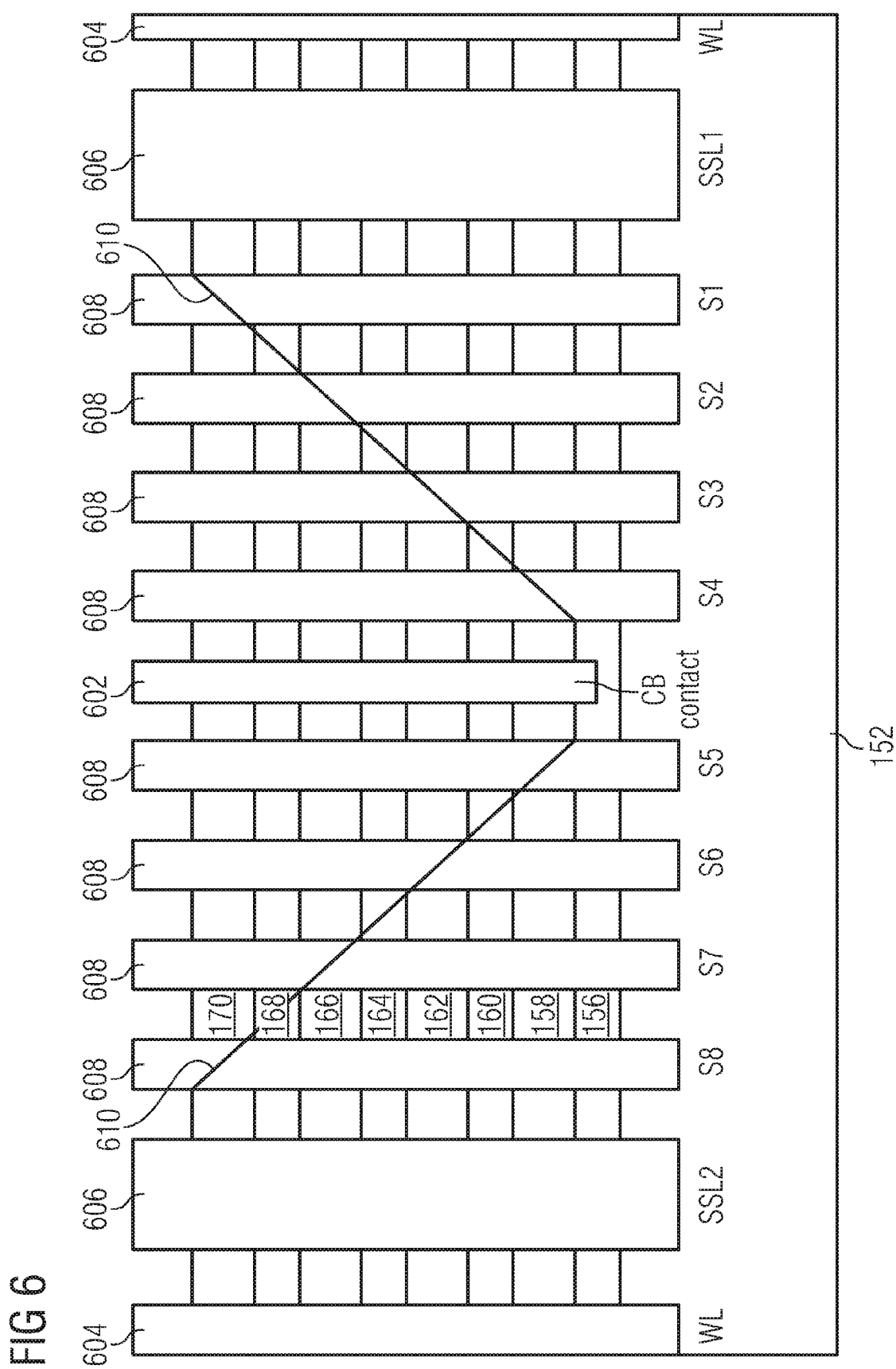

INTEGRATED CIRCUITS AND METHODS OF MANUFACTURING THEREOF

TECHNICAL FIELD

Embodiments of the invention relate to integrated circuits having memory cell arrangements and methods of manufacturing thereof.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a portion of an integrated circuit having a memory cell arrangement in a top view in accordance with one embodiment of the invention;

FIG. 1B illustrates a portion of an integrated circuit having a memory cell arrangement in a cross sectional view in accordance with one embodiment of the invention;

FIG. 2 illustrates a portion of an integrated circuit having a memory cell arrangement in a cross sectional view in accordance with one embodiment of the invention;

FIG. 3 illustrates a portion of an integrated circuit having a memory cell arrangement in a cross sectional view showing an implant scheme in accordance with one embodiment of the invention;

FIG. 4 illustrates a portion of an integrated circuit having a memory cell arrangement in a cross sectional view at a first time instant of its manufacture in accordance with one embodiment of the invention;

FIG. 5 illustrates a switch matrix region of an integrated circuit having a memory cell arrangement in a cross sectional view at a second time instant of its manufacture in accordance with one embodiment of the invention;

FIG. 6 illustrates a cross sectional view through a switch matrix and the border area of two adjacent NAND strings which are controlled via the switch transistors of the switch matrix in accordance with one embodiment of the invention;

DETAILED DESCRIPTION OF ILLUSTRATIVE EMBODIMENTS

Figure 1C:
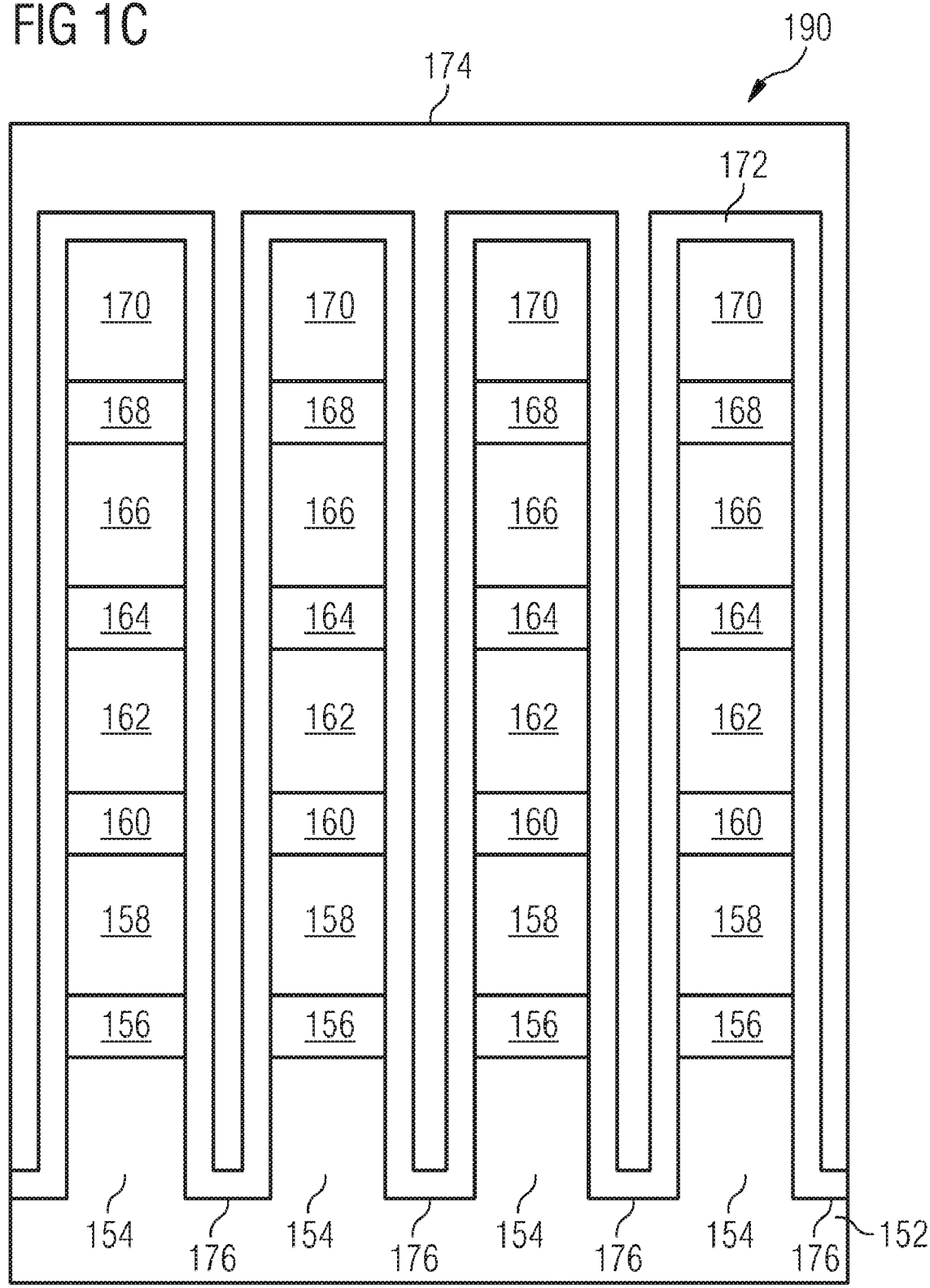
FIG. 1C illustrates a portion of an integrated circuit having a memory cell arrangement in a cross sectional view in accordance with another embodiment of the invention.

As used herein the terms connected and coupled are intended to include both direct and indirect connection and coupling, respectively. Furthermore, in one embodiment of the invention, the terms connected and coupled are intended to include a resistive connection or resistive coupling.

In embodiments of the invention, the described memory cell arrangements are integrated in one or in a plurality of integrated circuits.

Referring now to FIG. 1A, a layout of a portion of a memory cell arrangement 100 in accordance with one embodiment of the invention with a plurality of stacked non-volatile memory cells, is shown in a top view. It should be appreciated that FIG. 1A merely serves as an illustration of fabricating stacked non-volatile memory cells. The individual components shown in FIG. 1A are not true to scale.

The stacked non-volatile memory cells are arranged on vertical fins 102. Four fins 102 are shown in FIG. 1A. The four fins 102 are arranged substantially parallel to each other. Selection lines 104 (also referred to as word lines 104) are arranged in a direction within a plane that is perpendicular to a plane that is, e.g., defined by the longitudinal direction and the height direction of the fins 102 and are serving as lines for selecting a certain memory cell within the large number of thousands or millions or even billions or more of provided memory cells. Six word lines 104 are shown on top of the four fins 102 in a lower portion of the memory cell arrangement 100 and additional six word lines 104 are shown on top of the four fins 102 in an upper portion of the memory cell arrangement 100. In accordance with one embodiment of the invention, any number of word lines 104 may be provided, e.g., 32 word lines 104 or 64 word lines 104.

At the opposing ends of one periodically repeatedly occurring portion of the fins 102, bit line contact plugs 106 are provided. At least two bit line contact plugs 106 provide an electrical contact to each of the portion of the fins 102. The bit line contact plugs 106 and the word lines 104 can be connected to a readout circuit (not shown), thus enabling individual memory cells to be selected and read out by means of an external circuit. In one embodiment of the invention, the readout circuit may be implemented on the same die as the memory cells.

Between the two bit line contact plugs 106 of each fin 102, described from the bottom of the portion of the memory cell arrangement 100 of FIG. 1A, there are provided a plurality of (e.g., four) switch selection lines S1, S2, S3, S4 108. The selection lines S1, S2, S3, S4 108 are arranged in a switch matrix and are used to select a certain memory cell along the fins 102, as will be described in more detail below. Furthermore, a first additional switch selection line 110 is provided between a first selection line S1 108 of the fin 102 and a first word line 104 of the memory cell array including the memory cells. The first additional switch selection line 110 is also referred to as string selection line SSL1 110. In an embodiment of the invention, the switch matrix includes the string selection line SSL1 110. Furthermore, as shown in FIG. 1A, six word lines 104 are provided next to the first additional switch selection line SSL1 110. Furthermore, a second additional switch selection line 112 is provided next to the word lines 104 opposite to the first additional switch selection line SSL1 110. The second additional switch selection line GSL1 112 is also referred to as ground selection line 112. Moreover, a source line 116 is provided next to the second additional switch selection line GSL1 112. Next to the source line 116, there is provided another second additional switch selection line GSL2 118. In other words, the source line 116 is located between two second additional switch selection lines GSL1, GSL2, 112, 118. Then, further six word lines 104 are provided next to the other second additional switch selection line GSL2 118, followed by another first additional switch selection line SSL2 120, also referred to as other string selection line SSL2 120. A plurality of (e.g., four) switch selection lines S5, S6, S7, S8 108 are located between the other second additional switch selection line GSL2 118 on one side and bit line contact plugs 106 of each fin 102. In an embodiment of the invention, the switch matrix includes the additional string selection line SSL2 In an embodiment of the invention, this structure is repeatedly provided along the fins 102. The switch selection lines S1, S2, S3, S4, S5, S6, S7, S8, 108 have associated selection transistors, generally speaking associated selection gates, whose function will be described in more detail below. The additional switch selection lines 110, 112, 118, 120, serve as a switch between the memory cells and the transistors of the switch matrix. The additional switch selection lines 110, 112, 118, 120, may also have associated selection transistors, generally speaking associated selection gates. Therefore, except for the selection gate of the additional switch selection lines 110, 112, 118, 120, the gate lengths of the selection gates, for example, of the selection transistors, of the switch selection lines S1, S2, S3, S4, S5, S6, S7, S8, 108 can be designed having significantly smaller gate lengths, since voltages of about VCC are applied and the isolation of the floating node during programming inhibition is done by the selection gate of the respective additional switch selection line 110, 112, 118, 120. In one embodiment of the invention, the second additional switch selection lines GSL1, GSL2 112, 118 can be separated from each other. In another embodiment of the invention, the second additional switch selection lines GSL1, GSL2 112, 118 can be electrically coupled with one another, in other words, the second additional switch selection lines GSL1, GSL2 112, 118 can be short-circuited. In accordance with one embodiment of the invention, the additional switch selection lines 110, 112, 118, 120, represent a gate length that is greater than the gate length of the switch selection lines S1, S2, S3, S4, S5, S6, S7, S8, 108 in order to reduce the leakage current to ensure high boost voltage in the NAND string during program inhibit. In one embodiment of the invention, the additional switch selection lines 110, 112, 118, 120, represent a gate length in the range of about 150 nm to about 250 nm, e.g., in the range of about 175 nm to about 225 nm, e.g. of about 200 nm. In one embodiment of the invention, the switch selection lines S1, S2, S3, S4, S5, S6, S7, S8, 108 represent a gate length in the range of about 50 nm to about 130 nm, e.g., in the range of about 75 nm to about 120 nm, e.g., of about 100 nm. The greater gate length is, e.g., used for the so called self boost inhibit scheme during programming of a memory cell. Furthermore, in one embodiment of the invention, the source line 116 has a width in a range of about 100 nm to about 300 nm.

In an embodiment of the invention, the additional switch selection lines 110, 112, 118, 120 may respectively include a trapping layer, whereas in an alternative embodiment of the invention, the additional switch selection lines 110, 112, 118, 120 have no trapping layers. Furthermore, in an embodiment of the invention, the switch selection lines S1, S2, S3, S4, S5, S6, S7, S8, 108 may respectively include a trapping layer, whereas in an alternative embodiment of the invention, the switch selection lines S1, S2, S3, S4, S5, S6, S7, S8, 108 have no trapping layers.

By way of example, the programming of a memory cell can be carried out as follows:

The bit line of the memory cell to be programmed is provided with, e.g., 0 V, the word line of the memory cell to be programmed is provided with, e.g., +25 V. Furthermore, the directly adjacent bit lines of the bit line of the memory cell to be programmed are provided with, e.g., 3.3 V. The additional switch selection lines 110, 112, 118, 120, are provided with, e.g., 3.3V. The other word lines corresponding to the memory cells not to be programmed are provided with a pass voltage of, e.g., 10 V.

In an alternative embodiment of the invention, an additional switch matrix formed by additional switch selection lines (not shown) may be arranged between the source line 116 and the second additional switch selection line GSL1 112 (e.g., in a similar manner as described above, four switch selection lines) and the source line 116 and the other second additional switch selection line GSL2 118 (e.g., in a similar manner as described above, four switch selection lines), respectively.

Referring now to FIG. 1B, a cross sectional view of a partial memory cell arrangement 150 in accordance with one embodiment of the invention is shown. The cross sectional view is chosen in a direction perpendicular to the semiconductor surface and along a word line 104.

As shown in FIG. 1B, the partial memory cell arrangement 150 is arranged on a semiconductor substrate 152. The semiconductor substrate 152 may be part of one or more semiconductor wafers, e.g., of one or more semiconductor wafers having semiconductor material, an insulating layer and another semiconductor layer on top of the insulating layer. As will be discussed in more detail below, the one or more semiconductor layers may be formed by one or more silicon on insulator (SOI) semiconductor wafers. In the case of a plurality of SOI semiconductor wafers, the SOI semiconductor wafers may be coupled together by means of one or more wafer bonding processes.

In one embodiment of the invention, each fin structure 154 includes the semiconductor substrate 152, a first insulating layer 156 arranged on or above the upper surface of the semiconductor substrate 152, a first semiconductor layer 158 arranged on or above the upper surface of the first insulating layer 156, a second insulating layer 160 arranged on or above the upper surface of the first semiconductor layer 158, and a second semiconductor layer 162 arranged on or above the upper surface of the second insulating layer 160.

Clearly, each fin structure 154 thus includes two semiconductor fins including respective areas and being formed by the respective semiconductor layers 158, 162, the semiconductor fins being electrically isolated from each other by means of the respective insulating layers 156, 160. A portion of the upper surface of the substrate 152 between the fin structures 154 is exposed during the manufacturing process, in which the fin structures 154 are formed, as will be described in more detail below.

Furthermore, a patterned charge storage layer structure 172 is provided. The charge storage layer structure 172 covers the insulating layers 156, 160, the semiconductor layers 158, 162, as well as the exposed surface portions of the surface of the substrate 152 between the fin structures 154. In an alternative embodiment of the invention, the charge storage layer structure 172 covers only portions of the insulating layers 156, 160 and the semiconductor layers 158, 162.

In an alternative embodiment the fin of the uppermost layer has an additional buffer oxide layer on top of the fin but below the charge storage layer. In this way also the memory cells of the top most layer has only two sidewalls as active area while the conduction via the top layer is suppressed to a large degree. This ensures more homogeneity of the electrical behavior of the top most active layer compared to the layers below.

In one embodiment of the invention, the charge storage layer structure 172 is a floating gate structure including an insulating layer, e.g., a tunnel oxide layer (e.g., having a thickness in the range of 3 nm to 5 nm), the insulating layer covering the insulating layers 156, 160, the semiconductor layers 158, 162, as well as the exposed surface portions of the surface of the substrate 152 between the fin structures 154. Further, the floating gate structure includes a floating gate layer, e.g., made of polysilicon, being provided on the insulating layer. Furthermore, the floating gate structure includes another insulating layer, e.g., a gate oxide layer (e.g., having a thickness in the range of 5 nm to 15 nm), being provided on the floating gate layer.

In another embodiment of the invention, the charge storage layer structure 172 is a charge trapping layer structure. The charge trapping layer structure includes a dielectric layer stack including at least two dielectric layers being formed above one another, wherein charge carriers can be trapped in at least one of the at least two dielectric layers. By way of example, the charge trapping layer structure includes a charge trapping layer, which may include or consist of one or more materials being selected from a group of materials that consists of: aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In one embodiment of the invention, the charge trapping layer structure includes a dielectric layer stack including three dielectric layers being formed above one another, e.g., a first oxide layer (e.g., silicon oxide), a nitride layer as charge trapping layer (e.g., 1 silicon nitride) on the first oxide layer, and a second oxide layer (e.g., silicon oxide or aluminum oxide) on the nitride layer. This type of dielectric layer stack is also referred to as ONO layer stack. The ONO layer stack may be conformally deposited on the sidewalls of the fins, in other words, on the vertical sidewalls of the insulating layers 156, 160 and the semiconductor layers 158, 162, e.g., parallel to a plane that is defined by the longitudinal direction and the height direction of the fins.

In an alternative embodiment of the invention, the charge trapping layer structure includes two, four or even more dielectric layers being formed above one another.

On the patterned charge storage layer structure 172, a control gate layer 174 is provided, e.g., made of polysilicon or a metal such as copper or aluminum. The control gate layer 174 may be conformally deposited on the patterned charge storage layer structure 172.

In one embodiment of the invention, each fin structure 154 extends from a top surface of the control gate layer 174 through the charge storage layer structure 172, the plurality of semiconductor layers 158, 162 and the plurality of insulating layers 156, 160 at least into the bottommost insulating layer, i.e., the first insulating layer 156, or even into the semiconductor substrate 152, so that a bottom surface 176 is formed at a predetermined fin depth. As an option, an additional dielectric layer (not shown) may be disposed on the bottom surface 176. In one embodiment of the invention, however, the patterned charge storage layer structure 172 is disposed directly on the bottom surface 176.

In one embodiment of the invention, the patterned charge storage layer structure 172 is arranged in a direction substantially perpendicular to the orientation of the fins. The control gate layer 174 and, after patterning, the word lines formed by the patterned control gate layer 174 are arranged on the charge storage layer structure 172. The word lines have sidewalls (not shown in FIG. 1B) that are optionally covered by a spacer oxide layer, which protects the active regions of the transistors to be formed during the implantation of doping atoms for forming source/drain regions 114 (see FIG. 1A).

The source/drain regions 114 are formed in the semiconductor layers 158, 162 in the fins outside the word lines and the optional spacer oxide layer.

As shown in FIG. 1B, each fin structure 154 includes two strings of serially connected memory cells being formed by fin field effect transistors (FinFET). The strings run in the first direction. The FinFETs are electrically isolated from the semiconductor substrate 152 by means of one or more of the insulating layers 156, 160.

The FinFETs are attached to the bottommost layer of the charge storage layer structure 172, e.g., to the tunnel oxide layer (e.g. in the case of a floating gate structure) or to the first oxide layer (e.g., in the case of a charge trapping gate structure).

Thus, there are two memory cells (with vertical sidewalls included in fins forming an active region) formed one above the other (in vertical direction in the paper plane of FIG. 1B), two respective memory cells being included in a respective memory cell string (which runs perpendicular to the paper plane of FIG. 1B), which may be connected with each other in accordance with a NAND type connection scheme. In general, an arbitrary number of fins may be formed one above the other, each fin being isolated from the adjacent one of the fins by means of a respective insulating layer, thereby forming an arbitrary number of memory cells being included in a respective memory cell string, wherein the memory cells may be connected with each other in accordance with a NAND type connection scheme. If a channel is formed allowing a current flow through a respective FinFET, the current flows through the fin in a direction which is perpendicular to the paper plane of FIG. 1B).

The charge storage layer structure 172 provides non-volatile storage properties.

In an alternative embodiment of the invention, the memory cell arrangement 150 may include a third memory cell string, which may be connected with each other in accordance with a NAND type connection scheme. The third memory cell string may be formed by the semiconductor structure formed below the first insulating layer 156, i.e., by the fin-shaped portion of the semiconductor substrate 152. Thus, there are three memory cells formed one above the other with the fin-shaped portion of the bulk material, i.e., with the fin-shaped portion of the semiconductor substrate 152, providing the third NAND string. In another embodiment of the invention, the memory cells formed one above the other within the fin-shaped portions are controlled separately, thereby forming two memory cells in each fin-shaped portion of each level.

Referring now to FIG. 1C, a cross sectional view of a partial memory cell arrangement 190 in accordance with another embodiment of the invention is shown. The cross sectional view is chosen in a direction perpendicular to the semiconductor surface and along a word line 104. Similar elements of the partial memory cell arrangement 190 of FIG. 1C and the partial memory cell arrangement 150 of FIG. 1B will be assigned with identical reference numerals.

As shown in FIG. 1C, the partial memory cell arrangement 190 is arranged on a semiconductor substrate 152. The semiconductor substrate 152 may be part of one or more semiconductor wafers, e.g., of one or more semiconductor wafers including semiconductor material, an insulating layer and another semiconductor layer on top of the insulating layer. As will be discussed in more detail below, the one or more semiconductor layers may be formed by one or more silicon on insulator (SOI) semiconductor wafers. In the case of a plurality of SOI semiconductor wafers, the SOI semiconductor wafers may be coupled together by means of one or more wafer bonding processes.

In one embodiment of the invention, each fin structure 154 includes the semiconductor substrate 152, a first insulating layer 156 arranged on or above the upper surface of the semiconductor substrate 152, a first semiconductor layer 158 arranged on or above the upper surface of the first insulating layer 156, a second insulating layer 160 arranged on or above the upper surface of the first semiconductor layer 158, a second semiconductor layer 162 arranged on or above the upper surface of the second insulating layer 160, a third insulating layer 164 arranged on or above the upper surface of the second semiconductor layer 162, a third semiconductor layer 166 arranged on or above the upper surface of the third insulating layer 164, a fourth insulating layer 168 arranged on or above the upper surface of the third semiconductor layer 166, a fourth semiconductor layer 170 arranged on or above the upper surface of the fourth insulating layer 168.

Clearly, each fin structure 154 thus includes four semiconductor fins formed by the respective semiconductor layers 158, 162, 166, 170, the semiconductor fins being electrically isolated from each other by means of the respective insulating layers 156, 160, 164, 168. A portion of the upper surface of the substrate 152 between the fin structures 154 is exposed during the manufacturing process, in which the fin structures 154 are formed, as will be described in more detail below.

Furthermore, a patterned charge storage layer structure 172 is provided. The charge storage layer structure 172 covers the insulating layers 156, 160, 164, 168, the semiconductor layers 158, 162, 166, 170, as well as the exposed surface portions of the surface of the substrate 152 between the fin structures 154.

In one embodiment of the invention, the charge storage layer structure 172 is a floating gate structure including an insulating layer, e.g., a tunnel oxide layer (e.g., having a thickness in the range of 3 nm to 5 nm), the insulating layer covering the insulating layers 156, 160, 164, 168, the semiconductor layers 158, 162, 166, 170, as well as the exposed surface portions of the surface of the substrate 152 between the fin structures 154. Further, the floating gate structure includes a floating gate layer, e.g., made of polysilicon, being provided on the insulating layer. In an embodiment of the invention, the floating gate layer comprises metallically conductive portions forming the floating gates of the respective memory cells, and isolating portions to isolate respectively adjacent floating gates of adjacent memory cells. Furthermore, the floating gate structure includes another insulating layer, e.g., a gate oxide layer (e.g., having a thickness in the range of 5 nm to 15 nm), being provided on the floating gate layer.

In another embodiment of the invention, the charge storage layer structure 172 is a charge trapping layer structure. The charge trapping layer structure includes a dielectric layer stack including one or a plurality of at least two dielectric layers being formed above one another, wherein charge carriers can be trapped in at least one of the at least two dielectric layers. By way of example, the charge trapping layer structure includes a charge trapping layer, which may include or consist of one or more materials being selected from a group of materials that consists of: aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In one embodiment of the invention, the charge trapping layer structure includes a dielectric layer stack including three dielectric layers being formed above one another, namely a first oxide layer (e.g., silicon oxide), a nitride layer as charge trapping layer (e.g., silicon nitride) on the first oxide layer, and a second oxide layer (e.g., silicon oxide or aluminum oxide) on the nitride layer. This type of dielectric layer stack is also referred to as ONO layer stack. The ONO layer stack may be conformally deposited on the sidewalls of the fins and optionally in addition on the upper surface of the fins, in other words, on the vertical sidewalls of the insulating layers 156, 160, 164, 168 and the semiconductor layers 158, 162, 166, 170.

In an alternative embodiment of the invention, the charge trapping layer structure includes two, four or even more dielectric layers being formed above one another.

On the patterned charge storage layer structure 172, a control gate layer 174 is provided, e.g., made of polysilicon or a metal such as copper or aluminum. The control gate layer 174 may be conformally deposited on the patterned charge storage layer structure 172.

In one embodiment of the invention, each fin structure 154 extends from a top surface of the control gate layer 174 through the charge storage layer structure 172, the plurality of semiconductor layers 158, 162, 166, 170 and through the plurality of insulating layers 156, 160, 164, 168 at least into the bottommost insulating layer, i.e., the first insulating layer 156, or even into the semiconductor substrate 152, so that a bottom surface 176 is formed at a predetermined fin depth. As an option, an additional dielectric layer (not shown) may be disposed on the bottom surface 176, e.g., in case that the structure of the semiconductor substrate 152 is also used as a respective NAND string of memory cells. In one embodiment of the invention, however, the patterned charge storage layer structure 172 is disposed directly on the bottom surface 176.

In one embodiment of the invention, the patterned charge storage layer structure 172 is arranged in a direction substantially perpendicular to the orientation of the fins. The control gate layer 174 and, after patterning, the word lines formed by the patterned control gate layer 174 are arranged on the charge storage layer structure. The word lines have sidewalls (not shown in FIG. 1C) that are optionally covered by a spacer oxide layer, which protects the active regions of the transistors to be formed during the implantation of doping atoms for forming source/drain regions 114 (see FIG. 1A). The source/drain regions 114 are formed in the semiconductor layers 158, 162, 166, 170 in the fins outside the word lines and the optional spacer oxide layer.

As shown in FIG. 1C, each fin structure 154 includes four strings of serially connected memory cells being formed by fin field effect transistors (FinFET). The FinFETs are electrically isolated from the semiconductor substrate 152 by means of one or more of the insulating layers 156, 160, 164, 168.

The FinFETs are attached to the bottommost layer of the charge storage layer structure 172, e.g., to the tunnel oxide layer (e.g., in the case of a floating gate structure) or to the first oxide layer (e.g., in the case of a charge trapping gate structure).

Thus, there are four memory cells (with vertical sidewalls included in fins forming an active region) formed one above the other, one respective memory cell being included in a respective memory cell string, the memory cells of which may be connected with each other in accordance with a NAND type connection scheme in the first direction. In general, an arbitrary number of fins may be formed one above the other (in the height direction), each fin being isolated from the adjacent one of the fins by means of a respective insulating layer, thereby forming an arbitrary number of memory cells being included in a respective memory cell string, wherein the memory cells of a respective memory cell string may be connected with each other in accordance with a NAND type connection scheme.

The charge storage layer structure 172 provides non-volatile storage properties.

A method of manufacturing the memory cell arrangement will be described in the following. The following processes also further illustrate possible materials for the individual components and respective geometrical characteristics.

Referring now to FIG. 2, a method of forming a non-volatile stacked memory cell as shown in FIG. 1C is illustrated. In FIG. 2, a wafer arrangement 200 including a plurality of wafers is shown. In one embodiment of the invention, a plurality of silicon on insulator wafer (SOI wafer) is provided, e.g., four SOI wafers 202, 204, 206, 208. The SOI wafers 202, 204, 206, 208 of the wafer arrangement 200 may be single crystalline SOI wafer or polycrystalline wafer. The wafer arrangement 200 may be manufactured, e.g., by wafer bonding processes of the four SOI wafers 202, 204, 206, 208. However, any other suitable process can be used to manufacture the stack of multiple SOI wafers 202, 204, 206, 208. In an alternative embodiment of the invention, any number, e.g., up to 10 wafers may be stacked above one another.

A bottommost first SOI wafer 202 has a carrier, e.g., semiconductor carrier, e.g., a semiconductor substrate, e.g., the semiconductor substrate 152 (e.g., made of silicon), the first insulating layer 156 arranged on or above the upper surface of the semiconductor substrate 152, and the first semiconductor layer 158 arranged on or above the upper surface of the first insulating layer 156. A second SOI wafer 204 is disposed on or above the upper surface of the first semiconductor layer 158. The second SOI wafer 204 includes the second insulating layer 160 arranged on or above the upper surface of the first semiconductor layer 158 and the second semiconductor layer 162 arranged on or above the upper surface of the second insulating layer 160. A third SOI wafer 206 is disposed on or above the upper surface of the second semiconductor layer 162. The third SOI wafer 206 includes the third insulating layer 164 arranged on or above the upper surface of the second semiconductor layer 162 and the third semiconductor layer 166 arranged on or above the upper surface of the third insulating layer 164. A fourth SOI wafer 208 is disposed on or above the upper surface of the third semiconductor layer 166. The fourth SOI wafer 208 includes the fourth insulating layer 168 arranged on or above the upper surface of the third semiconductor layer 166 and the fourth semiconductor layer 170 arranged on or above the upper surface of the fourth insulating layer 168. In one embodiment of the invention, the semiconductor layers 158, 162, 166, 170 are made of silicon and the insulating layers 156, 160, 164, 168 are made of silicon dioxide. In one embodiment of the invention, the semiconductor layers 158, 162, 166, 170 and the insulating layers 156, 160, 164, 168 have a respective thickness in the range of about 50 nm to about 1 μm.

In the periphery area of the memory cell arrangement to be manufactured, e.g., of the NAND memory cell arrangement to be manufactured, according to a CMOS process in accordance with one embodiment of the invention, high-voltage devices such as charge pumps, are provided. The parasitic capacitance of such a device should be small. Therefore, an SOI wafer stack is not used as the substrate for the CMOS in the periphery area. In one embodiment of the invention, the SOI stack is removed in the CMOS periphery area. Then, a thin silicon dioxide layer is formed on the remaining semiconductor substrate 152 in the periphery area as well as on the top surface of the wafer arrangement 200, in other words on the upper surface of the fourth semiconductor layer 170 and on the sidewalls of the step between the upper surface of the fourth semiconductor layer 170 and the exposed semiconductor substrate 152 in the periphery area. The silicon dioxide layer has a thickness in the range of about 50 nm to about 500 nm. Then, the silicon dioxide layer is anisotropically etched from the top surface of the semiconductor substrate 152 in the CMOS periphery area. Thus, the array and a three dimensional (3D) switch matrix, which will be described in more detail below, as well as the side of the SOI stack part is covered by the silicon dioxide. Then, epitaxial silicon (Epi-Si) is selectively deposited in the CMOS periphery area. The thickness of the Epi-Si is given by the height of the SOI stack so that the entire wafer arrangement 200 has the same thickness all over the NAND memory area and the CMOS periphery area. The shallow trench isolation (STI) in the CMOS periphery area is formed in a conventional way.

A thermal silicon oxide layer is then formed on the upper surface of the structure that results in the processes described above. The thermal silicon oxide layer has several functions. It acts as a scattering oxide for the implant processes that follow and as a pad oxide for the silicon nitride hardmask. As will now be described in detail, the well implants for the three dimensional structure are special compared to a standard NAND process flow for FinFETs.

In the CMOS periphery area, the CMOS well implants correspond to the standard CMOS well implants.

In the memory cell region, in other words, in the memory cell array except for the area in which the switch matrix is to be manufactured, all four semiconductor layers 158, 162, 166, 170 are implanted with doping atoms such as boron (B).

In the switch matrix region, which also has a three dimensional structure (in one embodiment of the invention, the switch matrix region is provided in the fins), the implantation of the semiconductor layers in the three dimensional switch matrix (the semiconductor layers correspond to the semiconductor layers 158, 162, 166, 170 in the memory cell array is carried out as described in the following (see partial cross sectional view of the switch matrix 300 in FIG. 3).

In a first process, arsenic (As) is implanted in the semiconductor layers 158, 162, 166, 170 in the entire region of the switch matrix (in FIG. 3 symbolized by ellipses 302), e.g., with of concentration in the range of about $3*10^{17}$ cm$^{-3}$ to about $5*10^{18}$ cm$^{-3}$.

Then, indium (In) is implanted, as shown in the schematic, in a step wise way. In general, unlike the doping atoms used in the region, in which the memory cells should be formed, in the area of the 3D switch matrix, heavy ions are used as doping atoms, e.g., doping atoms having an atomic mass number (also referred to as proton number) of greater than 40, thereby achieving a strongly localized doping. By way of example, indium may be used as heavy ion material. In an alternative embodiment of the invention, boron fluoride (BF$_2$) may be used. Thus, a counter doping is provided in those regions such that the concentration of the heavy ions is greater than the concentration of arsenic. In one embodiment of the invention, the concentration of the heavy ions, e.g., of the indium ions, is in the range of about $1*10^{18}$ cm$^{-3}$ to about $1*10^{19}$ cm$^{-3}$.

In one embodiment of the invention, in the indium implant process, a first lithography mask is provided for a first indium implant partial process. The first lithography mask is arranged over the surface of the wafer arrangement 300 such that the entire surface of the wafer arrangement 300 is covered except for a first region 304, in which the indium atoms should be introduced into the fourth semiconductor layer 170. Next, indium atoms are implanted into the first region 304 with a first implantation energy that is selected such that the indium atoms are only introduced into the fourth semiconductor layer 170 and not further into the other three semiconductor layers 158, 162, 166. Clearly, the localized implantation of heavy ions is a counter doping of the regions which have been doped with arsenic atoms or phosphor atoms in a previous process. Thus, the counterdoped regions such as the first region 304 will be regions, in which p-implanted normally-off transistors will be formed. The other regions will be regions, in which normally-on transistors will be formed. In other words, the regions will form the active regions of switch transistors of the switch matrix. Depending on the active doping, the respective switch transistor of the switch matrix will be a normally-off transistor (i.e., a transistor that does not allow current flow without a sufficiently large gate voltage being applied to the respective transistor) or a normally-on transistor (i.e., a transistor that allows current flow even without an applied gate voltage). The implantation with arsenic or phosphor is selected such that the threshold voltage of the selection transistors is altered so that the selection transistors are permanently switched on. The implantation with heavy ions such as indium is selected such that the threshold voltage of the selection transistors is altered so that these selection transistors are permanently switched off. The first implantation energy used is suitably selected dependent from the materials and the layer thicknesses. In one embodiment of the invention, the first implantation energy is about 26 keV.

Then, a second lithography mask is provided for a second indium implant partial process. The second lithography mask is arranged over the surface of the wafer arrangement 300 such that the entire surface of the wafer arrangement 300 is covered except for a second region 306, in which the indium atoms should be introduced into the third semiconductor layer 166 (see FIG. 3). Next, indium atoms are implanted into the second region 306 with a second implantation energy that is selected such that the indium atoms are only introduced into the third semiconductor layer 166 and not into the other three semiconductor layers 158, 162, 170. Thus, the counterdoped second region 306 will be a region, in which a p-implanted normally-off transistor will be formed. The second implantation energy used is suitably selected dependent from the materials and the layer thicknesses. In one embodiment of the invention, the second implantation energy is about 120 keV.

Next, a third lithography mask is provided for a third indium implant partial process. The third lithography mask is arranged over the surface of the wafer arrangement 200 such that the entire surface of the wafer arrangement 200 is covered except for a third region 308, in which the indium atoms should be introduced into the second semiconductor layer 162 (see FIG. 3). Next, indium atoms are implanted into the third region 308 with a third implantation energy that is selected such that the indium atoms are only introduced into the second semiconductor layer 162 and not into the other three semiconductor layers 158, 166, 170. Thus, the counterdoped third region 308 will be a region, in which a p-implanted normally-off transistor will be formed. The third implantation energy used is suitably selected dependent from the materials and the layer thicknesses. In one embodiment of the invention, the third implantation energy is about 240 keV.

Finally, a fourth lithography mask is provided for a fourth indium implant partial process. The fourth lithography mask is arranged over the surface of the wafer arrangement 200 such that the entire surface of the wafer arrangement 200 is covered except for a fourth region 310, in which the indium atoms should be introduced into the first semiconductor layer 158 (see FIG. 3). Next, indium atoms are implanted into the fourth region 310 with a fourth implantation energy that is selected such that the indium atoms are only introduced into the first semiconductor layer 158 and not into the other three semiconductor layers 162, 166, 170. Thus, the counterdoped fourth region 310 will be a region, in which a p-implanted normally-off transistor will be formed. The fourth implantation energy used is suitably selected dependent from the materials and the layer thicknesses. In one embodiment of the invention, the fourth implantation energy is about 500 keV.

In one embodiment of the invention, the implantation energies used are selected such that the following holds true:
First implantation energy<Second implantation energy<Third implantation energy<Fourth implantation energy.

In one embodiment of the invention, heavy ions such as indium are used as doping material because indium can be implanted in a better localized way than boron. The indium implant should overcompensate the arsenic implant in the shown regions 304, 306, 308, 310, as described above.

Referring now to FIG. 4, which shows a schematic cross sectional view 400 of the memory cell array and the switch matrix, after having implanted the heavy ions in the respective regions of the switch matrix 300, the memory cell array and the switch matrix, e.g., the corresponding active areas are patterned. In the patterning process, trenches 402 are etched using a silicon oxide/silicon nitride hardmask (not shown) so as to form a three-dimensional FinFET. For the switch matrix the etch is done in the way that each fin includes only one indium implanted area in one of the SOI layers. The trenches 402 extend into the semiconductor substrate 152 so that the bottom of each trench 402 is located vertically below the first insulating layer 156. Then, the silicon oxide/silicon nitride hardmask is removed again. Thus, a plurality of fin structures 154 is formed.

Furthermore, a charge storage layer structure 172 is formed on the fin structures 154. In one embodiment of the invention, a floating gate structure is formed. In another embodiment of the invention, a charge trapping layer structure is formed. The charge trapping layer structure may include a plurality of dielectric layers being stacked above one another, e.g., at least two dielectric layers. In one embodiment of the invention, three dielectric layers are formed above one another, e.g., an oxide/nitride/oxide (ONO) layer stack including a first oxide layer (such as silicon dioxide), a nitride layer (such as silicon nitride) on or above the first oxide layer, and a second oxide layer (such as silicon dioxide or aluminum oxide) on or above the nitride layer.

In the CMOS periphery area, the charge storage layer structure 172 and the fins are removed and a high voltage gate oxide layer (e.g., having a large thickness), e.g., for the high voltage devices in the CMOS periphery area, and a low voltage gate oxide layer (e.g., having a small thickness), e.g., for the low voltage devices in the CMOS periphery area, are formed.

Referring now back to FIG. 1C, which illustrates a cross sectional view of a portion of a NAND string including a plurality of serially in the first direction coupled memory cell transistors, following the processes described with reference to FIG. 4, p$^+$-type polysilicon is deposited such that the trenches 402 are at least filled, possibly even overfilled with polysilicon. Then, tungsten silicide (WSi) is deposited. In an alternative embodiment of the invention, a silicon diffusion barrier is deposited and then tungsten (W) is deposited as world line.

Next, gate stacks of the FinFETs are patterned. In one embodiment of the invention, the process flow ensures that no gate metal is deposited on sidewalls, since the metal part of the gate stack is difficult to be selectively etched selectively. In order to ensure this, the polysilicon fill is used, which can be etched very selectively against the ONO layer stack, the high voltage gate oxide and the low voltage gate oxide.

Furthermore, a side wall oxidation (SWOX) is carried out. In case of tungsten being used in the gate stack, the tungsten is encapsulated before the SWOX formation to avoid oxidation of the tungsten.

In the CMOS periphery area, a standard process flow for the formation of low voltage devices and high voltage devices using LDD (lightly doped drain) and HDD (highly doped drain) implants.

After having patterned the word lines, a tilted angle n+-implant into the semiconductor layers 158, 162, 166, 170, is carried out (in FIG. 5 symbolized by means of arrows 502) using the word lines as mask, thereby forming n+-regions or plasma implant in a self-aligned manner, the n+-regions serving as source/drain regions of the transistors to be formed.

Referring now to FIG. 6, which illustrates a cross sectional view along cross sectional view A-A' in FIG. 1A through a switch matrix and the border area of two adjacent NAND strings which are controlled via the switch transistors of the switch matrix, in the switch matrix region, a bit line contact line 602 is formed. Furthermore, FIG. 6 shows portions of the word lines that extend along the sidewall of the fin structure so as to control the current flow through the respective active regions of the memory cell transistors as well as through the switch transistors. Thus, first word lines 604 are provided for the memory cell transistors. The first word line 604 of the left side of FIG. 6 represents the word line of the last (e.g., the $32^{nd}$) memory cell transistor of a first NAND memory cell string region and the first word line 604 of the right side of FIG. 6 represents the word line of the first memory cell transistor of a second NAND memory cell string region. Furthermore, second word lines 606 are provided for the selection transistors of the respective NAND memory cell string region. Moreover, third word lines 608 are shown.

As can be gathered from FIG. 6, in one embodiment of the invention, the switch matrix has a symmetric structure with the bit line contact line 602 representing a symmetry axis. The four third word lines 608 on the left side with regard to the bit line contact line 602 are used to select one NAND string in the first NAND memory cell string region and the four third word lines 608 on the right side with regard to the bit line contact line 602 are used to select one NAND string in the second NAND memory cell string region. Thus, the bit line contact line 602 is shared by the two NAND memory cell string regions.

Diagonal line 610 indicates p-implanted normally-off transistors in the area in which they cross the respective third word line 608 and the respective semiconductor layer 158, 162, 166, 170. All the other transistors of the switch matrix (SW1 to SW8) are normally-on transistors. In one embodiment of the invention, the diagonal line 610 indicates channel regions, which may be doped with indium, for example.

In one embodiment of the invention, the bit line contact line 602 is formed by depositing a hardmask, e.g., a silicon nitride hardmask on the structure of FIG. 1C. Then, a lithographic process is carried out in the switch matrix region so as to prepare an etching structure in a subsequent etching process. Then, a trench is etched in the region, in which the bit line contact line 602 should be formed, the trench extending into the wafer arrangement 200 down to the first insulating layer 156. After the etching is completed, the photo resist that is provided in the lithographic process is removed, in other words, stripped, and the trench is filled with conductive material, e.g., with metal, e.g., with a layer structure including one or more barrier layers (if necessary) and the trench filling material. In one embodiment of the invention, the barrier layers include a stack of a titanium (Ti)/titanium nitride (TiN) and the trench filling material is made of tungsten (W). The overfilling material is then removed, e.g., using a chemical mechanical polishing (CMP) process. Thus, the bit line contact line 602 is completed.

Then, the process flow includes a common FinFET NAND metallization scheme in which the common processes for providing metallization planes for the FinFET NAND structure.

The process of manufacturing the memory cell arrangement 150 of FIG. 1B is similar to the above described process of manufacturing the memory cell arrangement 190 of FIG. 1C with the difference that the processes which are related to the third insulating layer 164, the third semiconductor layer 166, the fourth insulating layer 168 and the fourth semiconductor layer 170 are omitted. Therefore, the process of manufacturing the memory cell arrangement 150 of FIG. 1B will not be described in detail again.

In one embodiment of the invention, a 3D integration of FinFET memory cells is provided by stacking ordinary FinFET SONOS NAND strings laying horizontally in multiple layered silicon stacks. The sidewalls are covered by a charge storage layer structure (e.g., a floating gate structure or a charge trapping layer structure) and word lines that surround the multiple SOI stack. The metallization and the sensing circuitry is as for conventional NAND. The layers beneath are switched on and off by a three dimensional vertical switch matrix using strongly localizable heavy ion implants (e.g., indium implants). Thus, a high storage density is achieved, wherein conventional sensing schemes and metallization can be used.

In this context, it should be mentioned that the source line 116 in one embodiment of the invention has a similar extension into the fin 102 compared with the bit line contact plugs 602 with the difference, that the source line 116 runs continuously over the plurality of fins 102, as shown in FIG. 1A. In an embodiment of the invention, the source line 116 has illustratively the shape of a non-interrupted wall instead of a comb structure in its cross section taken along the width direction of the fins 102 (in FIG. 1A seen from the left to the right).

In an alternative embodiment to the invention, the switch matrix elements may have the same function as the string select elements. In this embodiment of the invention, the switch functionality of the switch selection lines S1, S2, S3, S4, S5, S6, S7, S8 108 may already be provided in the string select elements, e.g., in the string selection lines 110.

Figure 7:
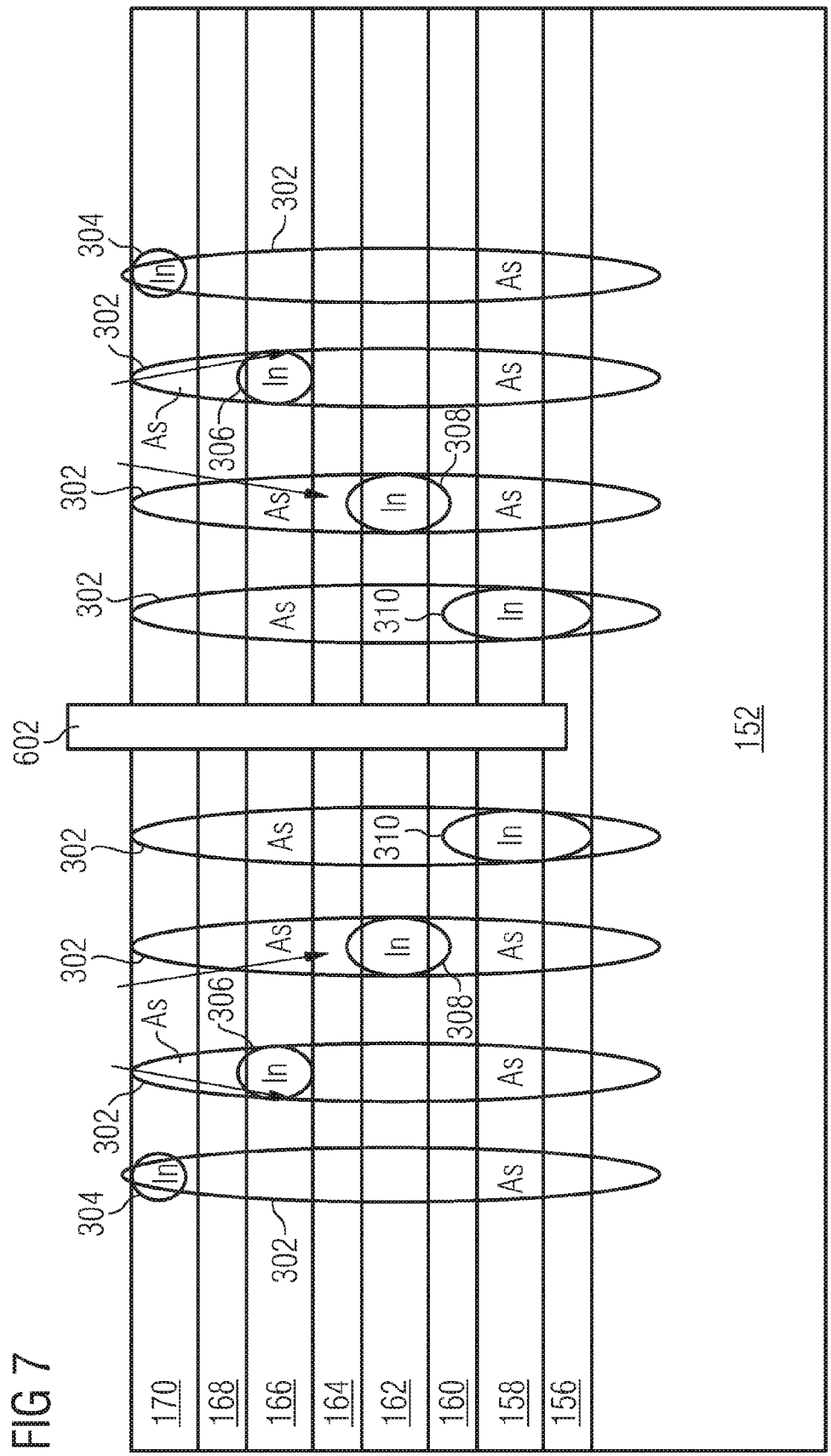
FIG. 7 shows the cross sectional view of a switch matrix in accordance with one embodiment of the invention.

FIG. 7 shows the cross sectional view of a switch matrix in accordance with one embodiment of the invention including the above described implant scheme, wherein the word lines are not shown.

Figure 8:
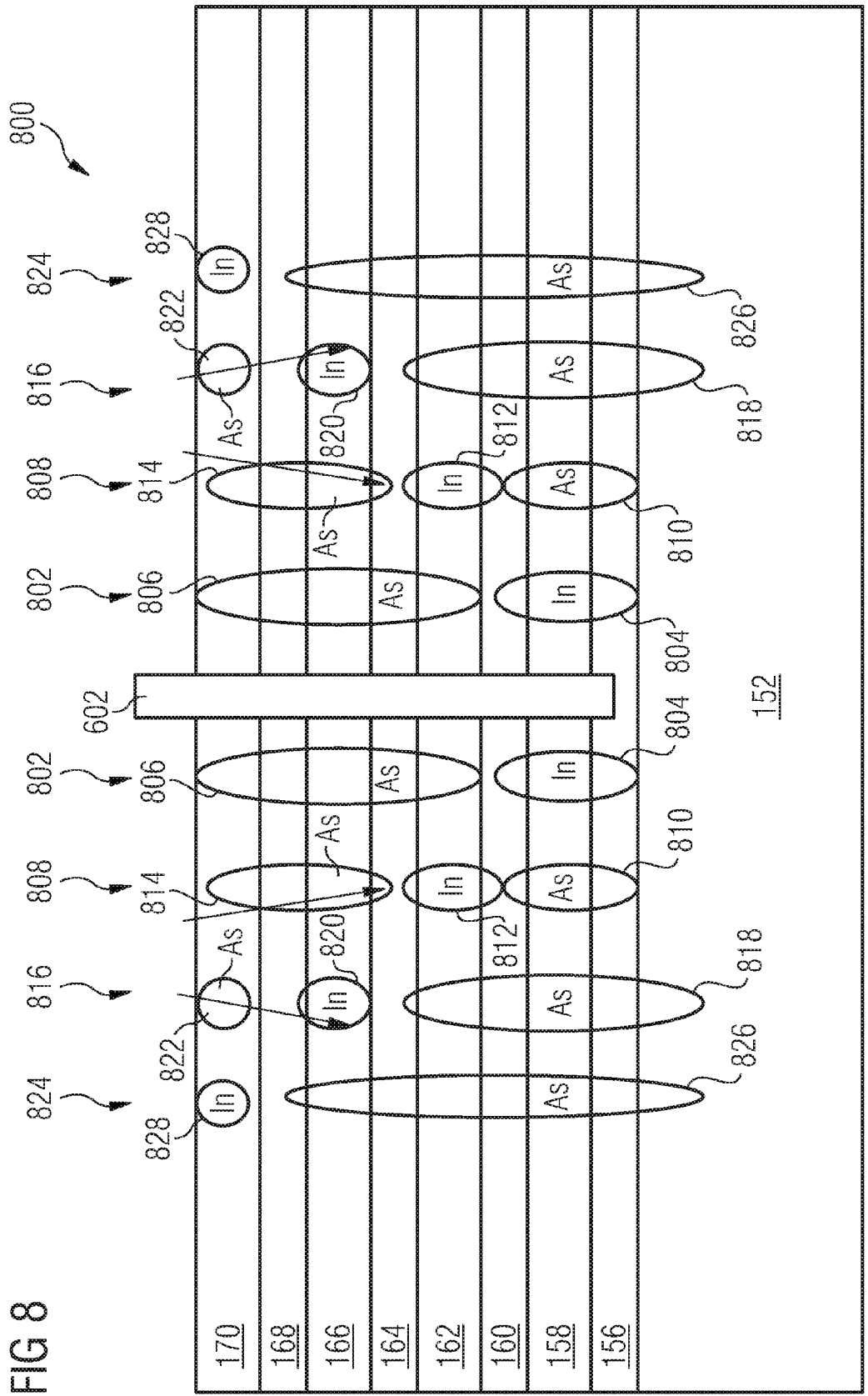
FIG. 8 shows the cross sectional view of a switch matrix in accordance with another embodiment of the invention.

FIG. 8 shows the cross sectional view of a switch matrix 800 in accordance with another embodiment of the invention showing another implant scheme, without the word lines being shown.

In accordance with the embodiment shown in FIG. 8, the processes of implanting the arsenic doping atoms and the indium doping atoms are individually carried out for each one of the four switch transistor column types, in other words, for each of the switch transistor columns, in which the indium doping atoms are implanted into the same semiconductor layer of the fin structure.

By way of example, in a first process, first switch transistor columns 802 are exposed to a first indium implantation process using a first implantation mask that covers the entire surface of the wafer arrangement except for the regions of the first switch transistor columns 802. Next, indium atoms are implanted into a first region 804 with a first implantation energy that is selected such that the indium atoms are only introduced into the first semiconductor layer 158 and not into the other three semiconductor layers 162, 166, 170 (e.g., the first implantation energy is 26 keV). Next, using the first implantation mask, arsenic atoms are implanted into a second region 806 that includes the second semiconductor layer 162, the third semiconductor layer 166 and the fourth semiconductor layer 170. The arsenic atoms are implanted into the second region 806 with a second implantation energy that is selected such that the arsenic atoms are only introduced into the second semiconductor layer 162, the third semiconductor layer 166 and the fourth semiconductor layer 170, but not into the first semiconductor layer 158.

In one embodiment of the invention, in a second process, second switch transistor columns 808 are exposed to a second indium implantation process using a second implantation mask that covers the entire surface of the wafer arrangement except for the regions of the second switch transistor columns 808. Next, using the second implantation mask, arsenic atoms are implanted into a third region 810 that includes the first semiconductor layer 158. The arsenic atoms are implanted into the third region 810 with a third implantation energy that is selected such that the arsenic atoms are only introduced into the first semiconductor layer 158, but not into the second semiconductor layer 162, the third semiconductor layer 166 and the fourth semiconductor layer 170 (e.g., the second implantation energy is 120 keV). Subsequently, indium atoms are implanted into a fourth region 812 with a fourth implantation energy that is selected such that the indium atoms are only introduced into the second semiconductor layer 162 and not into the other three semiconductor layers 158, 166, 170. Next, using the second implantation mask, arsenic atoms are implanted into a fifth region 814 that includes the third semiconductor layer 166 and the fourth semiconductor layer 170. The arsenic atoms are implanted into the fifth region 814 with a fifth implantation energy that is selected such that the arsenic atoms are only introduced into the third semiconductor layer 166 and the fourth semiconductor layer 170, but not into the first semiconductor layer 158 and the second semiconductor layer 162.

In one embodiment of the invention, in a third process, third switch transistor columns 816 are exposed to a third indium implantation process using a third implantation mask that covers the entire surface of the wafer arrangement except for the regions of the third switch transistor columns 816. Next, using the third implantation mask, arsenic atoms are implanted into a sixth region 818 that includes the first semiconductor layer 158 and the second semiconductor layer 162. The arsenic atoms are implanted into the sixth region 818 with a sixth implantation energy that is selected such that the arsenic atoms are only introduced into the first semiconductor layer 158 and the second semiconductor layer 162, but not into the third semiconductor layer 166 and the fourth semiconductor layer 170. Subsequently, indium atoms are implanted into a seventh region 820 with a seventh implantation energy that is selected such that the indium atoms are only introduced into the third semiconductor layer 166 and not into the other three semiconductor layers 158, 162, 170 (e.g., the third implantation energy is 240 keV). Next, using the third implantation mask, arsenic atoms are implanted into a eighth region 822 that includes the fourth semiconductor layer 170. The arsenic atoms are implanted into the eighth region 822 with an eighth implantation energy that is selected such that the arsenic atoms are only introduced into the fourth semiconductor layer 170, but not into the first semiconductor layer 158, the second semiconductor layer 162 and the third semiconductor layer 166.

In one embodiment of the invention, in a fourth process, fourth switch transistor columns 824 are exposed to a fourth indium implantation process using a fourth implantation mask that covers the entire surface of the wafer arrangement except for the regions of the fourth switch transistor columns 824. Next, using the fourth implantation mask, arsenic atoms are implanted into a ninth region 826 that includes the first semiconductor layer 158, the second semiconductor layer 162 and the third semiconductor layer 166. The arsenic atoms are implanted into the ninth region 826 with a ninth implantation energy that is selected such that the arsenic atoms are only introduced into the first semiconductor layer 158, the second semiconductor layer 162 and the third semiconductor layer 166, but not into the fourth semiconductor layer 170. Subsequently, indium atoms are implanted into a tenth region 828 with a tenth implantation energy that is selected such that the indium atoms are only introduced into the fourth semiconductor layer 170 and not into the other three semiconductor layers 158, 162, 166 (e.g., the fourth implantation energy is 500 keV).

Figure 9:
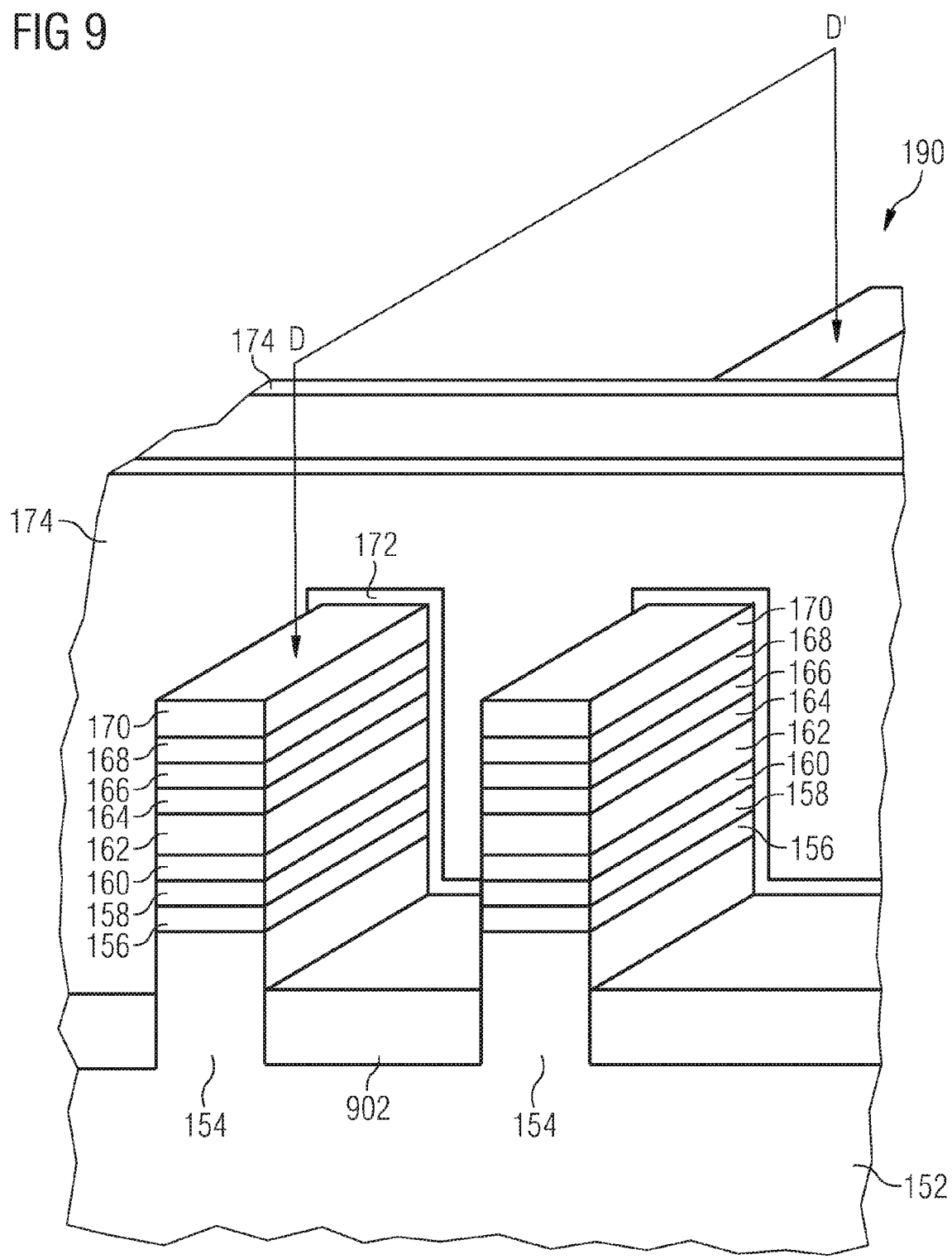
FIG. 9 illustrates a perspective view of the integrated circuit having a memory cell arrangement of FIG. 1C.

The resulting structure for the memory cell arrangement 190 according to FIG. 1C is shown in FIG. 9 (in this case also showing the optional additional dielectric layer 902 being disposed on the bottom surface. FIG. 9 shows two adjacent fin structures 154 with common word lines 174 in a perspective view.

Figure 10:
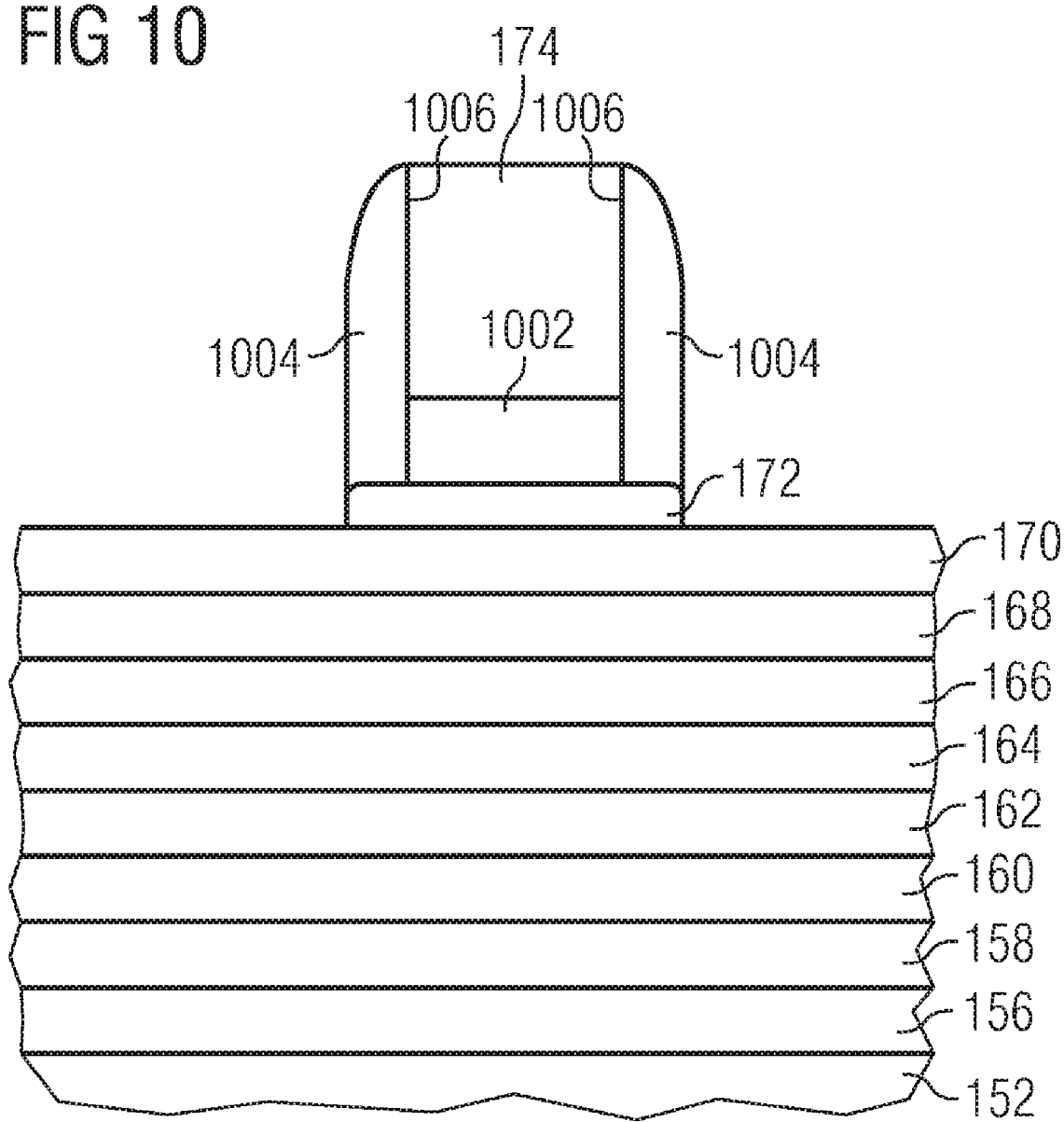
FIG. 10 illustrates a portion of an integrated circuit having a memory cell arrangement in accordance with one embodiment of the invention.

The structure shown in FIG. 9 is further explained with reference to FIG. 10. FIG. 10 shows a cross sectional view of the memory cell arrangement 190 according to FIG. 9 along a plane indicated by lines D and D' in FIG. 9. FIG. 10 illustrates a cross-sectional view through the fin structure 154. In addition to FIG. 9, a metal containing layer 1002 underneath the word line 174 is visible. Furthermore, it is shown that a spacer oxide layer 1004 is arranged on top of the charge trapping layer structure 172 and is covering the sidewalls 1006 of the metal containing layer 1002 and the word line 174.

In one embodiment of the invention, the top surface of the word line 174 is silicided in order to reduce the resistance of the word line 174.

Figure 11:
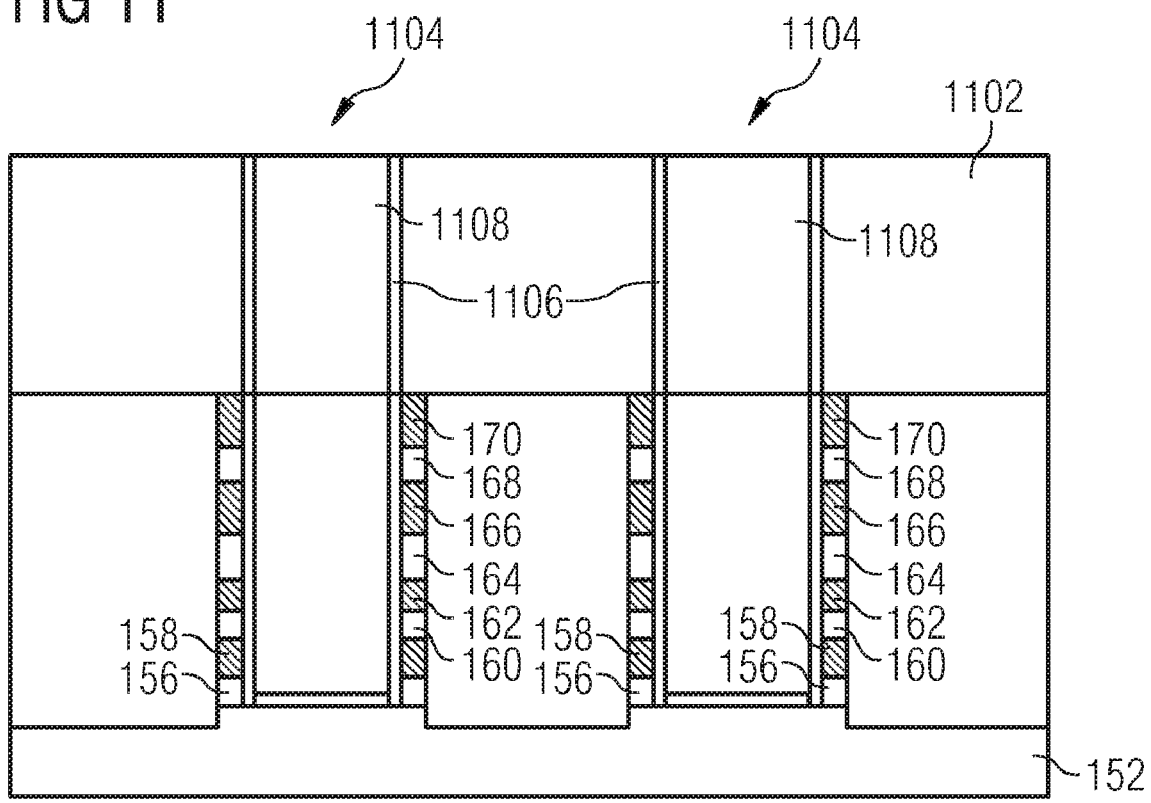
FIG. 11 illustrates a portion of an integrated circuit having a memory cell arrangement in accordance with one embodiment of the invention.

In further processes, interconnecting metal layers are applied in a conventional manner. The further processes include depositing further dielectric layers 1102, etching contact holes and applying the interconnect wiring (see FIG. 11, which shows a cross sectional view at the contact hole).

In order to contact the memory cells as discussed above to the interconnecting metal layers, a contact hole 1104 is etched extending from the surface from one or more dielectric layers 1102 down to the first insulating layer 156 of a respective fin structure 154. The contact hole 1104 is filled with a barrier layer 1106 on the sidewalls and on the bottom wall of the contact hole 1104. The barrier layer 1106 includes, e.g., titanium and/or titanium nitride. Afterwards, the contact hole 1104 is filled with a contact plug material 1108, e.g., tungsten. At least two contact plugs are formed at a respective end of each fin structures 154, so as to be able to contact both ends of the NAND strings along a respective fin structure 154.

Figure 12:
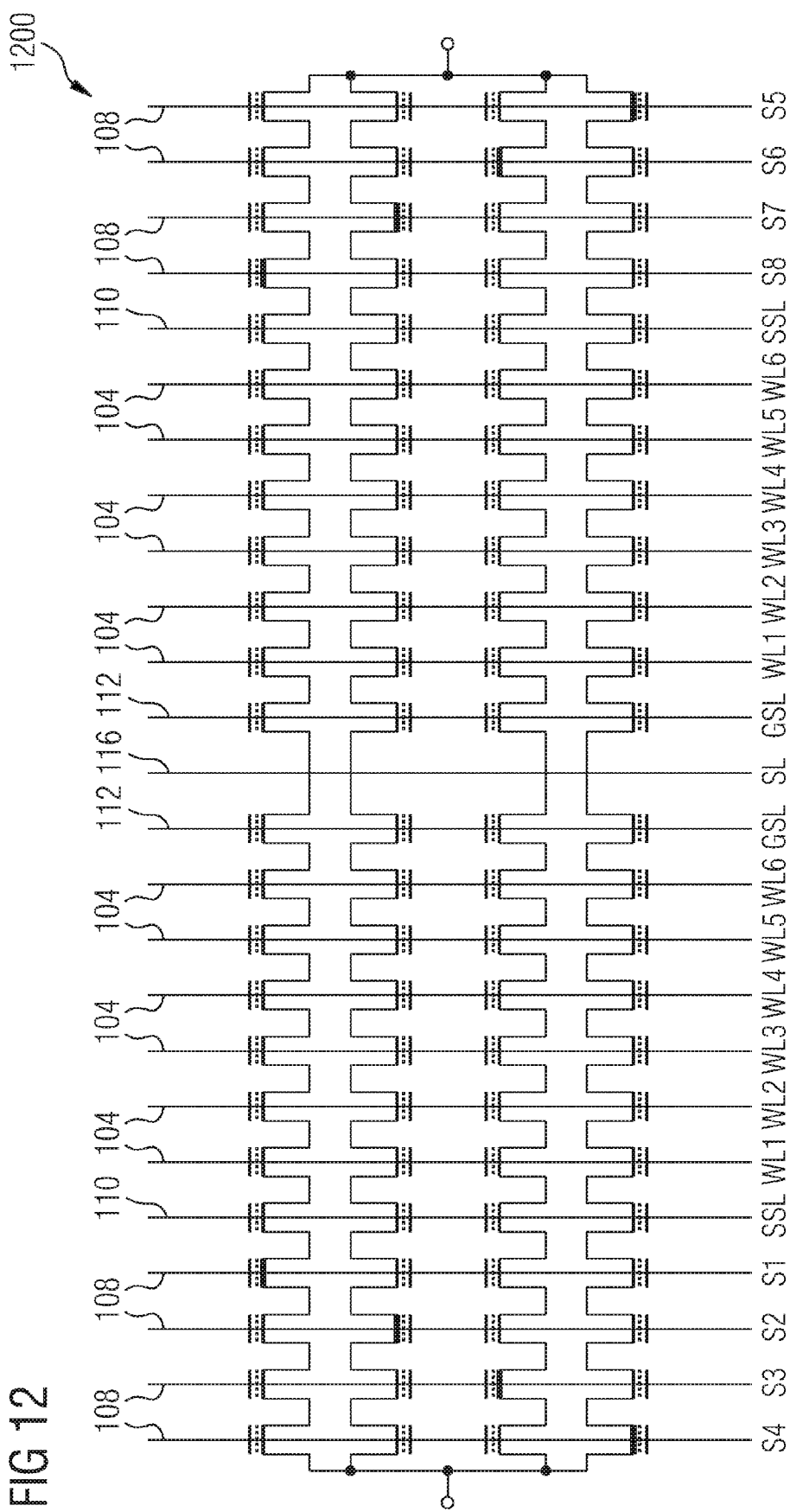
FIG. 12 illustrates a circuit diagram of a portion of an integrated circuit having a memory cell arrangement in accordance with one embodiment of the invention.

Referring now to FIG. 12, a diagram 1200 of the memory cell arrangement 190 of FIG. 1C with memory cells according to FIGS. 2 to 11, are schematically shown. As shown in FIG. 12, in one embodiment of the invention, 12 memory cells (twice six memory cells) are provided, which are shown in FIG. 12. Each NAND string is shown in FIG. 12 in a respective chain of transistors. For each memory cell, the FinFETs including the respective active regions are controlled via the word line 174, in FIG. 12 also denoted with WL1, WL2, WL3, WL4, WL5, WL6. The selection transistors being configured as normally-off transistors, are indicated by a bold line in the transistor symbol. The outer selection transistors are connected to the contact plugs 106, 1108. As shown in FIG. 12, the memory cells form a NAND memory cell chain. In order to build a non-volatile NAND memory having a memory size of 512 Mb or more, many memory cells are needed. In different embodiments of the invention, the number of memory cells is selected to be 16 or 32 or another multiple of 8 bit. It should be mentioned that in an alternative embodiment, an arbitrary number of memory cells can be selected.

By applying a certain voltage to the selection lines (in FIG. 12 denoted with S1 to S8) and to the word lines WL1, WL2, WL3, WL4, WL5, WL6, each memory cell can be addressed individually during read-out along the chain of the fin structures 154. Programming and erasing can be carried out by selecting appropriate programming voltages and erasing voltage, respectively.

In one embodiment of the invention, the metallization of the memory cell arrangement is provided such that the bit lines are provided in the so called metallization plane 0 (i.e., in the first metallization plane above the word lines), and the bit lines run, e.g., perpendicular to the main direction of the word lines. Furthermore, supply lines are provided in the so called metallization plane 1 (i.e., in the second metallization plane above the word lines, sometimes referred to as Metal 1) for contacting and reducing the RC delay of the well contacts (not shown), the source line 116 and the select gates. In an embodiment of the invention, additional metallization plane may be provided above the mentioned metallization planes. Furthermore, it should be mentioned that in alternative embodiments of the invention, an arbitrary number of metallization planes may be provided and the above mentioned lines may be provided in different metallization planes than described above.

In another embodiment of the invention, the bit lines are arranged in the metallization plane 1 (i.e., in the second metallization plane above the word lines) and are connected with the contact plugs 106, wherein the metallization plane 0 (i.e., the first metallization plane above the word lines, sometimes referred to as Metal 0) provides the well contacts and the supply lines for the select gates and a low ohmic source line further decreasing the ohmic resistance of the source line 116.

Figure 13A:
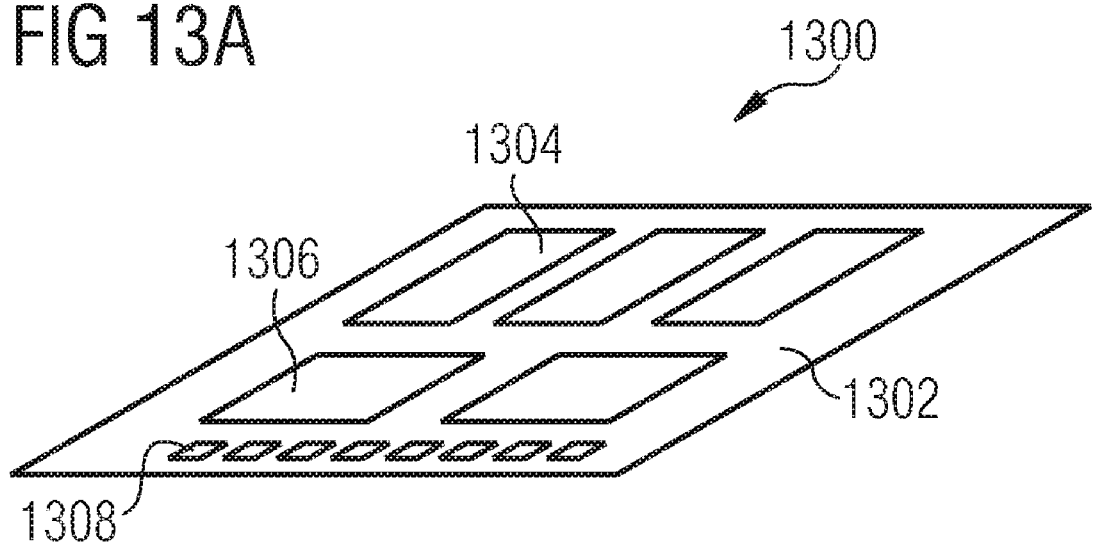
FIGS. 13A and 13B show a memory module (FIG. 13A) and a stackable memory module (FIG. 13B) in accordance with an embodiment of the invention.
Figure 13B:
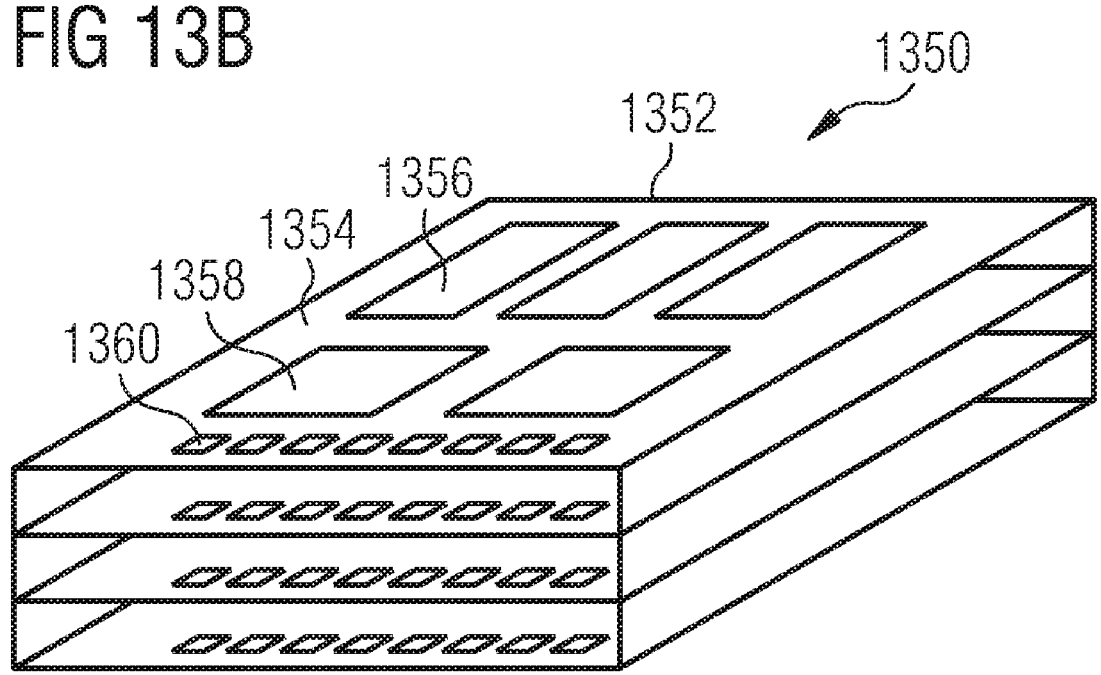

As shown in FIGS. 13A and 13B, in some embodiments, memory devices such as those described herein may be used in modules. In FIG. 13A, a memory module 1300 is shown, on which one or more memory devices 1304 are arranged on a substrate 1302. The memory device 1304 may include numerous memory cells, each of which uses a memory element in accordance with an embodiment of the invention. The memory module 1300 may also include one or more electronic devices 1306, which may include one or more memories, one or more processing circuitries, one or more control circuitries, one or more addressing circuitries, one or more bus interconnection circuitries, or one or more other circuitries or electronic devices that may be combined on a module with a memory device, such as the memory device 1304. Additionally, the memory module 1300 includes multiple electrical connections 1308, which may be used to connect the memory module 1300 to other electronic components, including other modules.

As shown in FIG. 13B, in some embodiments, these modules may be stackable, to form a stack 1350. For example, a stackable memory module 1352 may contain one or more memory devices 1356, arranged on a stackable substrate 1354. The memory device 1356 contains memory cells that employ memory elements in accordance with an embodiment of the invention. The stackable memory module 1352 may also include one or more electronic devices 1358, which may include one or more memories, one or more processing circuitries, one or more control circuitries, one or more addressing circuitries, one or more bus interconnection circuitries, or one or more other circuitries or electronic devices that may be combined on a module with a memory device, such as the memory device 1356. Electrical connections 1360 are used to connect the stackable memory module 1352 with other modules in the stack 1350, or with other electronic devices. Other modules in the stack 1350 may include additional stackable memory modules, similar to the stackable memory module 1352 described above, or other types of stackable modules, such as stackable processing modules, control modules, communication modules, or other modules containing electronic components.

In one embodiment of the invention, a memory cell arrangement is provided, having a fin structure extending in its longitudinal direction as a first direction, wherein the fin structure includes a first insulating layer, a first active region disposed above the first insulating layer, a second insulating layer disposed above the first active region, and a second active region disposed above the second insulating layer. In one embodiment of the invention, the memory cell arrangement further includes a charge storage layer structure disposed above the fin structure in a second direction, the second direction being different from the first direction, wherein the charge storage layer structure is at least next to at least one sidewall of the fin structure covering at least a portion of the first active region and at least a portion of the second active region, and a control gate disposed above the charge storage layer structure in the second direction.

In one embodiment of the invention, the fin structure further includes a third insulating layer disposed above the second active region in the first direction and a third active region disposed above the third insulating layer in the first direction. Furthermore, in another embodiment of the invention, the fin structure further includes a fourth insulating layer disposed above the third active region and a fourth active region disposed above the fourth insulating layer in the first direction. Generally, an arbitrary number of active regions may be stacked one above the other in the first direction, the active regions being isolated from each other by means of a respective insulating layer that is arranged between two respective active regions in the first direction. In this way, a vertical stack of a plurality of active regions and therewith a vertical stack of a plurality of memory cells are provided, thereby increasing the storage density of a memory cell arrangement in accordance with one embodiment of the invention. The respective memory cells can be addressed (and thus read and/or programmed) individually, as will be described in more detail below. Thus, a memory cell arrangement is achieved, e.g., a non-volatile memory cell arrangement, using less space on a substrate, e.g., on a silicon substrate. In one embodiment of the invention, less than 10 or 10 active regions may be stacked, thereby increasing the storage density by a factor of 10 if compared to a common fin field effect transistor.

In one embodiment of the invention, an active region may be understood to be a region, in which a channel of a field effect device, e.g., of a field effect transistor may be formed during operation of the field effect device. The active region may be completely or partly filled by the formed channel.

In one embodiment of the invention, the fin structure includes at least one additional first active region and at least one additional second active region. The first active region and the at least one additional first active region are coupled with each other in serial connection in the first direction. Further, the second active region and the at least one additional second active region are coupled with each other in serial connection in the first direction. In one embodiment of the invention, at least one additional charge storage layer structure is provided above at least a portion of the at least one additional first active region and at least a portion of the at least one additional second active region in the second direction, and at least one additional control gate is provided above the at least one additional charge storage layer structure in the second direction. In this way, a memory cell transistor arrangement is formed having two or more serially (in the first direction) coupled memory cell transistors having an active region, a storage layer structure disposed above (e.g., directly on or coupled via one or a plurality of intermediate layers with) the active region and a control gate disposed above (e.g., directly on or coupled via one or a plurality of intermediate layers with) the storage layer structure. Clearly, each portion of the stack having one or more respective active regions includes a plurality of serially coupled (via the active regions, optionally also via respective source/drain regions) memory cells, which may form a NAND string of a plurality of memory cells.

In one embodiment of the invention, the fin structure includes a plurality of additional first active regions and a plurality of additional second active regions. The first active region and the additional first active regions are coupled with each other in serial connection in the first direction, thereby forming a portion of a first NAND string. The second active region and the plurality of additional second active regions are coupled with each other in serial connection in the first direction, thereby forming a portion of a second NAND string. Thus, a plurality (generally, an arbitrary number of) vertically stacked NAND strings of memory cells are provided in the memory cell arrangement in accordance with one embodiment of the invention. In this way, a NAND memory cell arrangement is provided using reduced amount of area on the substrate.

In one embodiment of the invention, one or more additional fin structures may be provided and arranged adjacent to the fin structure or to one another. Each of the additional fin structures extending in its longitudinal direction substantially also in the first direction and including a first insulating layer, a first active region disposed above the first insulating layer, a second insulating layer disposed above the first active region, and a second active region disposed above the second insulating layer. Furthermore, one or more additional charge storage layer structures may be provided above the at least one additional fin structure in the second direction, and one or more additional control gates may be provided above the respective additional charge storage layer structures in the second direction.

In one embodiment of the invention, source/drain regions may be provided next to the first active region and the second active region, the source/drain regions being electrically coupled to the respective adjacent active region or active regions in the first direction. In one embodiment of the invention, two laterally adjacent active regions in the first direction may be coupled to one shared source/drain region. In an alternative embodiment of the invention, the electrical coupling between a respective active region and a source/drain region may be improved by means of a lightly doped drain (LDD) region and/or by means of so-called halo implants. The source/drain regions may be implemented as separate elements external to the fin structure. However, in one embodiment of the invention, the source/drain regions are formed within the fin structure, e.g., in case that a plurality of serially coupled active regions are formed in the same fin structure.

The first active region may be made of semiconductor material, e.g., silicon or silicon germanium. However, any other suitable semiconductor material may be used in an alternative embodiment of the invention. In another embodiment of the invention, the second active region may be made of semiconductor material as well, the semiconductor material of the second active region possibly being the same semiconductor material that is used for the first active region. However, different semiconductor materials may be used for the first active region and the second active region.

In one embodiment of the invention, the charge storage layer structure is disposed above at least one sidewall of the fin structure covering at least a portion of the first active region at least a portion of the second active region. In another embodiment of the invention, the charge storage layer structure is disposed above at least two opposite sidewalls of the fin structure covering at least a portion of the first active region and at least a portion of the second active region. In addition, the charge storage layer structure may be provided on or disposed above the top surface of the fin structure as in a usual one-bit fin field effect transistor. In one embodiment of the invention, recesses are included in a substrate, wherein each recess has a bottom surface to a depth at least partially within the bottommost active region (e.g., the semiconductor layer, in which the bottommost active region will be formed), thereby defining one or more fins that include the semiconductor layers and the insulating layers which will be used for manufacturing the plurality of vertically stacked memory cells. In one embodiment of the invention, a dielectric layer is provided covering the bottom surface of the recesses. The patterned charge storage layer structure covers the fins (and optionally the dielectric layer) and is arranged in a direction substantially different to the longitudinal direction of the one or more fins. A word line (optionally including a control gate or being provided above the control gate) having sidewalls is arranged on or disposed above the top of the patterned charge storage layer structure. Furthermore, a spacer oxide layer may be provided for an improved source/drain implant of the one or more fins between the active regions. The optional spacer oxide layer covers the sidewalls of the word line. As a further option, source/drain regions may be formed on exposed surfaces of the one or more fins outside the word line and the spacer oxide layer.

In one embodiment of the invention, each fin has a longitudinal direction (which may be the first direction), a width direction (which may be equal to the second direction) and a height direction (which is also referred to as vertical direction and which is substantially perpendicular to the main processing surface of the substrate). In one embodiment of the invention, the expression "sidewall of the fin" refers to a fin wall that runs substantially parallel to a plane that is defined by the longitudinal direction and the height direction.

In one embodiment of the invention, the charge storage layer structure is a floating gate layer structure, e.g., including a floating gate made of electrically conductive material such as polysilicon.

In another embodiment of the invention, the charge storage layer structure is a nanocrystalline type layer structure comprising nanocrystals embedded in a dielectric, the nanocrystals storing electrical charges. The nanocrystals may be made of semiconducting material such as, for example, silicon. In an alternative embodiment of the invention, the nanocrystals may be made of insulating material such as, for example, hafnium oxide ($HfO_2$). In yet another embodiment of the invention, the nanocrystals may be made of electrically conductive material such as, for example, tungsten (W).

In another embodiment of the invention, the charge storage layer structure is a charge trapping layer structure including one or more dielectric layers (e.g., two dielectric layers, three dielectric layers or even four or more dielectric layers) in a charge trapping layer stack trapping electrical charge carriers. The charge trapping layer structure may include a charge trapping layer trapping electrical charge carriers. The charge trapping layer may be made of a material being selected of a group of materials that consists of silicon nitride, yttrium oxide, hafnium oxide, zirconium oxide, hafnium silicates, hafnium aluminates, aluminum nitride (AlN), aluminum oxide ($Al_2O_3$), etc. In one embodiment of the invention, the charge trapping layer structure includes three dielectric layers such as a first oxide layer (such as a silicon oxide layer) as the bottommost layer, a nitride layer (such as a silicon nitride layer) being deposited on or above the first oxide layer, and a second oxide layer (such as a silicon oxide layer or an aluminum oxide layer). In another embodiment of the invention, the charge trapping layer structure includes three dielectric layers including a high-k dielectric material as the topmost dielectric layer.

In accordance with one embodiment of the invention, the bottommost oxide layer of the oxide/nitride/oxide layer stack may be made of silicon oxide or of high-k-material containing silicon oxide. The high-k-material containing silicon oxide may comprise one or a plurality of layers. In one embodiment of the invention, a high-k-material may be understood as being a material having a dielectric constant of greater than 3.9 (3.9 is the dielectric constant of silicon oxide). In one embodiment of the invention, the plurality of layers of high-k-material may contain a plurality of different high-k-materials.

In one embodiment of the invention, the uppermost oxide layer of the oxide/nitride/oxide layer stack is made of one or a plurality of materials selected from a group of materials consisting of: silicon oxide, aluminum oxide, high-k-material, mixtures of those materials, silicates of those materials, aluminates of those materials. In an alternative embodiment of the invention, the same materials may be used for the uppermost oxide layer as for the charge trapping layer trapping electrical charge carriers with the difference that the materials used for the uppermost oxide layer does not have traps. This can be achieved by using a suitable type of processing the uppermost oxide layer during or after the deposition thereof.

The charge trapping layer structure may have a thickness of less than 50 nm, e.g., a thickness in the range of 5 nm to 25 nm.

Furthermore, the control gate may include a metal containing layer structure. In one embodiment of the invention, the metal containing layer structure includes titanium and/or titanium nitride. The metal containing layer structure may have a thickness of less than 50 nm, e.g., a thickness in the range of 5 nm to 15 nm.

In one embodiment of the invention, a select unit is provided individually selecting a sector of transistors formed by the first active region and the second active region, respectively. The select unit may be formed external from the fin structure. However, in one embodiment of the invention, the select unit is formed in the fin structure, thereby simplifying the process of manufacturing the memory cell arrangement. The select unit may include a plurality of select lines that includes a plurality of select transistors, which may be arranged in a switch matrix. One or more of the plurality of select transistors are normally-on transistors; i.e., transistors which have a low resistance, although no voltage or a voltage smaller than the threshold voltage of the transistor is applied to the gate of the respective transistor. One or more of the plurality of the select transistors are normally-off transistors; i.e., transistors which have a high resistance if no voltage or a voltage smaller than the threshold voltage of the transistor is applied to the gate of the respective transistor. In one embodiment of the invention, a normally-on transistor may be understood as being a transistor having a threshold voltage lower than zero ($V_t<0$). In one embodiment of the invention, a normally-off transistor may be understood as being a transistor having a threshold voltage greater than zero ($V_t>0$).

The number of select lines comprising normally-on select transistors in the switch matrix may be equal to the number of active regions being stacked above one another in the fin structure.

On the other hand, the total number of select lines between bit line contacts and memory cell arrays may be equal or greater by one than the number of active regions being disposed above one another in the fin structure.

Furthermore, in one embodiment of the invention, some or all of the normally-off transistors are doped with heavy ions. In the embodiment, in which the transistors are arranged in the switch matrix in a stacked fashion one above the other, using heavy ions for doping the normally-off transistors in the switch matrix enables an exact long lasting positioning thereof within those active regions. The diffusion of the doping atoms into adjacent normally-on transistors is prevented due to their heaviness, thereby ensuring a reliable control of the memory cells. Thus, strongly localized implants of the normally-off transistors are provided, thereby enabling selectively doping of only one layer in the vertical axis with reference to the main processing surface of the memory cell arrangement. Heavy ions are to be understood in accordance with one embodiment of the invention of as being ions having an atomic mass number (also referred to as proton number) of greater than 40. By way of example, indium may be used as a heavy ion material. In an alternative embodiment of the invention, material being selected from a group of materials consisting of boron fluoride ($BF_2$).

The switch matrix may further include a bit line contact being connected with a respective one of the plurality of transistors. In one embodiment of the invention, the switch matrix further includes a bit line contact region coupling the memory cells of the first active region and the second active region via the select transistors.

The plurality of transistors may be arranged in the switch matrix in a symmetrical manner with the bit line contact as the symmetry axis. In this case, the bit line contact serves as a shared bit line contact for the memory cell transistors of the respective side of the switch matrix and for the memory cells vertically stacked that are connected to the shared bit line contact via the select unit.

In another embodiment of the invention, at least one of the transistors of the switching unit has a greater gate length than the other transistors of the switching unit. In one embodiment of the invention, the at least one of the transistors of the switching unit having a greater gate length is arranged between the memory cells and the other transistors of the switching unit.

In one embodiment of the invention, a NAND memory cell arrangement is provided, having a fin structure extending in its longitudinal direction as a first direction, including a first insulating layer, a plurality of first active regions of a first plurality of memory cells being connected with each other in serial connection in the first direction and being disposed above the first insulating layer, a second insulating layer disposed above the first active regions, and a plurality of second active regions of a second plurality of memory cells being coupled with each other in serial connection in the first direction and being disposed above the second insulating layer. Furthermore, in one embodiment of the invention, the NAND memory cell arrangement includes a plurality of charge storage layer structures disposed above the fin structure in a second direction, the second direction being different from the first direction, and a plurality of control gate layers disposed above the charge storage layer structures in the second direction, the control gate layers being coupled with each other to form a first plurality of NAND coupled memory cells including the plurality of first active regions, and a second plurality of NAND coupled memory cells including the plurality of second active regions.

At least some of the plurality of charge storage layer structures may be floating gate layer structures.

In an alternative embodiment of the invention, at least some of the plurality of charge storage layer structures are charge trapping layer structures.

Furthermore, the charge storage layer structure may be disposed above at least two opposite sidewalls of the fin structure covering at least a portion of the first active region and at least a portion of the second active region.

Moreover, a select unit may be provided individually selecting one transistor of transistors formed by the first active region and the second active region, respectively.

In one embodiment of the invention, the select unit is formed in the fin structure. The select unit may include a plurality of transistors. In accordance with this embodiment of the invention, some of the plurality of transistors may be normally-off transistors and some of the plurality of transistors may be normally-on transistors.

In accordance with another embodiment of the invention, a NAND memory cell arrangement is provided, having a fin structure extending in its longitudinal direction as a first direction, including a first insulating layer, a plurality of first active regions of a first plurality of memory cells being coupled with each other in serial connection in the first direction and being disposed above the first insulating layer, a second insulating layer disposed above the first active regions, a plurality of second active regions of a second plurality of memory cells being connected with each other in serial connection in the first direction and being disposed above the second insulating layer, a plurality of charge storage layer structures above the fin structure in a second direction, the second direction being different from the first direction, wherein the charge storage layer structures are at least next to at least one sidewall of the fin structures covering at least a portion of the first active region and at least a portion of the second active region, a plurality of control gate layers above the charge storage layer, the control gate layers being connected with each other to form a first plurality of NAND coupled memory cells including the plurality of first active regions, and a second plurality of NAND coupled memory cells including the plurality of second active regions in the second direction, and a switch arrangement having switches individually selecting the memory cells of the memory cells. In one embodiment of the invention, each charge storage layer structure being disposed above at least one sidewall of the fin structure covering at least a portion of the first active region and at least a portion of the second active region The charge storage layer structures may be floating gate layer structures. In an alternative embodiment of the invention, the plurality of charge storage layer structures are charge trapping layer structures.

Furthermore, the charge storage layer structure may be disposed above at least one sidewall of the fin structure covering at least a portion of the first active region and at least a portion of the second active region. In another embodiment of the invention, the charge storage layer structure is disposed above at least two opposite sidewalls of the fin structure covering at least a portion of the first active region and at least a portion of the second active region.

In one embodiment of the invention, the select unit is formed in the fin structure.

In another embodiment of the invention, the select unit has a plurality of transistors. Some of the plurality of transistors may be normally-off transistors and some of the plurality of transistors may be normally-on transistors.

In one embodiment of the invention, a method of manufacturing a memory cell arrangement is provided, including forming a fin structure extending in its longitudinal direction as a first direction, including a first insulating layer in a first direction, a first active region disposed above the first insulating layer in the first direction, a second insulating layer disposed above the first active region in the first direction, a second active region disposed above the second insulating layer in the first direction. The method further includes forming a charge storage layer above the fin structure in a second direction, the second direction being different from the first direction, wherein the charge storage layer is at least next to at least one sidewall of the fin structure covering at least a portion of the first active region and at least a portion of the second active region, and forming a control gate layer above the charge storage layer in the second direction. The charge storage layer structure may be formed above at least one sidewall of the fin structure covering at least a portion of the first active region and at least a portion of the second active region.

In another embodiment of the invention, at least one additional first active region and at least one additional second active region is formed in the fin structure. The first active region and the at least one additional first active region are coupled with each other in serial connection in the first direction and the second active region and the at least one additional second active region are coupled with each other in serial connection in the first direction.

In one embodiment of the invention, at least one additional charge storage layer structure is formed above at least a portion of the at least one additional first active region and at least a portion of the at least one additional second active region. Further, at least one additional control gate is formed above the at least one additional charge storage layer structure.

In one embodiment of the invention, source/drain regions are formed next to the first active region and the second active region.

Spacers may be formed on the side walls of the control gate.

The method may further include patterning a layer structure, the layer structure having a first insulating layer in a first direction, a first semiconductor layer disposed above the first insulating layer in the first direction, a second insulating layer disposed above the first semiconductor layer in the first direction and a second semiconductor layer disposed above the second insulating layer in the first direction. The patterning may be carried out by etching portions of the first insulating layer, portions of the first semiconductor layer, portions of the second insulating layer and portions of the second semiconductor layer. Anisotropic etching such as reactive ion etching (RIE) may be used for patterning.

In another embodiment of the invention, the forming the select unit includes forming the select unit in the fin structure.

Furthermore, at least two transistors may be formed in the select unit. At least two of the transistors may be formed as normally-off transistors. The at least two normally-off transistors may be formed, inter alia, by implanting the active region of each normally-off transistor with heavy ions such as indium or boron fluoride. Furthermore, at least two of the transistors may be formed as normally-on transistors. The at least two normally-on transistors may be formed, inter alia, by implanting the active region of each normally-on transistor with arsenic or phosphor, for example. In one embodiment of the invention, the forming of at least two transistors includes implanting the active region of each transistor with first doping atoms of a first conductivity type (e.g., n-type), and implanting the active region of each transistor with second doping atoms of a second conductivity type (e.g., p-type), the second conductivity type being different from the first conductivity type.

In one embodiment of the invention, a memory cell arrangement is provided, including a plurality of memory cells being arranged above one another in a fin structure and a switching structure including switching elements, at least some of the switching elements being arranged above one another in the height direction of the fin structure, each switching element being assigned to a respective memory cell, e.g., to a respective memory cell that is arranged on the same height level of the fin structure.

Although the described embodiments refer to NAND memories, the memory cell structure is independent from the memory cell array structure and therefore the memory cells in accordance with the embodiments of the invention may also be used in any memory cell array structure other than a NAND memory cell array structure in an alternative embodiment of the invention.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. An integrated circuit having a memory cell arrangement, the memory cell arrangement comprising:
    a fin structure extending in a longitudinal direction as a first direction, the fin structure comprising:
        a first insulating layer;
        a first active region disposed above the first insulating layer;
        a second insulating layer disposed above the first active region; and
        a second active region disposed above the second insulating layer;
    a charge storage layer structure disposed adjacent at least one sidewall of the fin structure covering at least a portion of the first active region and at least a portion of the second active region; and
    a control gate disposed adjacent the charge storage layer structure.

2. The integrated circuit of claim 1, wherein the fin structure further comprises:
    a third insulating layer disposed above the second active region; and
    a third active region disposed above the third insulating layer.

3. The integrated circuit of claim 1, wherein the fin structure comprises at least one additional first active region and at least one additional second active region,
    the first active region and the at least one additional first active region being coupled with each other in a serial connection in the first direction,
    the second active region and the at least one additional second active region being coupled with each other in serial connection in the first direction.

4. The integrated circuit of claim 3, further comprising:
    at least one additional charge storage layer structure disposed above at least a portion of the at least one additional first active region and at least a portion of the at least one additional second active region in a second direction; and
    at least one additional control gate disposed above the at least one additional charge storage layer structure in the second direction.

5. The integrated circuit of claim 1, further comprising source/drain regions adjacent the first active region and the second active region.

6. The integrated circuit of claim 1, wherein the fin structure further comprises source/drain regions adjacent the first active region and the second active region.

7. The integrated circuit of claim 1, wherein the charge storage layer structure comprises a floating gate layer structure.

8. The integrated circuit of claim 1, wherein the charge storage layer structure comprises a nanocrystalline type layer structure comprising nanocrystals embedded in a dielectric, the nanocrystals storing electrical charges.

9. The integrated circuit of claim 1, wherein the charge storage layer structure comprises a charge trapping layer structure.

10. The integrated circuit of claim 9, wherein the charge trapping layer structure comprises at least two dielectric layers.

11. The integrated circuit of claim 9, wherein the charge trapping layer structure comprises a charge trapping layer comprising a material selected from the group consisting of silicon nitride, yttrium oxide, hafnium oxide, zirconium oxide, a hafnium silicate, a hafnium aluminate, aluminum nitride, and aluminum oxide.

12. The integrated circuit of claim 9, wherein the charge trapping layer structure comprises an oxide/nitride/oxide layer stack.

13. The integrated circuit of claim 12, wherein a bottommost oxide layer of the oxide/nitride/oxide layer stack comprises silicon oxide, or one or more high-k-material layers containing silicon oxide.

14. The integrated circuit of claim 12, wherein an uppermost oxide layer of the oxide/nitride/oxide layer stack comprises one or more materials selected from the group of materials consisting of silicon oxide, aluminum oxide, high-k-material, mixtures of those materials, silicates of those materials, aluminates of those materials, silicon nitride, yttrium oxide, hafnium oxide, zirconium oxide, hafnium silicates, hafnium aluminates, aluminum nitride, and aluminum oxide.

15. The integrated circuit of claim 1, further comprising a select unit individually selecting sectors of memory cell transistors formed by the first active region and the second active region.

16. The integrated circuit of claim 15, wherein the select unit is formed in the fin structure.

17. The integrated circuit of claim 15, wherein the select unit comprises a plurality of select lines.

18. The integrated circuit of claim 17, further comprising:
a further fin structure extending in a longitudinal direction as a first direction, the further fin structure comprising:
- a first insulating layer;
- a first active region disposed above the first insulating layer;
- a second insulating layer disposed above the first active region; and
- a second active region disposed above the second insulating layer;

a charge storage layer structure disposed adjacent at least one sidewall of the fin structure, the charge storage layer covering, at least a portion of the first active region and at least a portion of the second active region; and
a control gate disposed adjacent the charge storage layer.

19. The integrated circuit of claim 18, wherein the select unit is coupled between the fin structure and the further fin structure.

20. The integrated circuit of claim 17, wherein the plurality of select lines are arranged in a switch matrix.

21. The integrated circuit of claim 20, wherein:
some of the plurality of select lines comprise normally-off select transistors; and
others of the plurality of select lines comprise normally-on select transistors.

22. The integrated circuit of claim 21, wherein the number of select lines comprising normally-on transistors in the switch matrix is equal to the number of active regions that are disposed above one another in the fin structure.

23. The integrated circuit of claim 21, wherein the total number of select lines in the switch matrix between a bit line contact and memory cell transistors is equal to the number of active regions disposed above one another in the fin structure or is greater by one than the number of active regions disposed above one another in the fin structure.

24. The integrated circuit of claim 21, wherein at least some of the normally-off transistors are doped with heavy ions.

25. The integrated circuit of claim 24, where at least some of the normally-off transistors are doped with indium or boron fluoride.

26. The integrated circuit of claim 20, wherein the switch matrix further comprises a bit line contact region coupling each of the memory cell transistors of the first active region and the second active region via the select lines.

27. The integrated circuit of claim 26, wherein at least one of the transistors of the switch matrix has a greater gate length than all other transistors of the switch matrix.

28. An integrated circuit having a NAND memory cell arrangement, the integrated circuit comprising:
a fin structure extending in a first direction, comprising:
- a first insulating layer;
- a plurality of first active regions of a first plurality of memory cells being coupled with each other in serial connection in the first direction and being disposed above the first insulating layer;
- a second insulating layer disposed above the first active regions; and
- a plurality of second active regions of a second plurality of memory cells being coupled with each other in serial connection in the first direction and being disposed above the second insulating layer;

a plurality of charge storage layer structures disposed adjacent at least one sidewall of the fin structure covering at least a portion of the first active region and at least a portion of the second active region; and
a plurality of control gate layers disposed next to the charge storage layer structures;
the memory cells being coupled with each other to form a first plurality of NAND coupled memory cells comprising the plurality of first active regions, and a second plurality of NAND coupled memory cells comprising the plurality of second active regions.

29. The integrated circuit of claim 28, further comprising a select unit individually selecting one sector of the plurality of memory cells formed by the first active region and the second active region.

30. The integrated circuit of claim 29, wherein the select unit is formed in the fin structure.

31. An integrated circuit having a NAND memory cell arrangement, the integrated circuit comprising:
a fin structure extending a first direction, the fin structure comprising:
- a first insulating layer;
- a plurality of first active regions of a first plurality of memory cells coupled with each other in serial connection in the first direction and disposed above the first insulating layer;
- a second insulating layer disposed above the first active regions; and
- a plurality of second active regions of a second plurality of memory cells coupled with each other in serial connection in the first direction and disposed above the second insulating layer;

a plurality of charge storage layers disposed adjacent at least one sidewall of the fin structure covering at least a portion of the first active region and at least a portion of the second active region;
a plurality of control gate layers disposed next to the charge storage layer, the control gate layers being coupled with each other to form a first plurality of NAND coupled memory cells comprising the plurality of first active regions, and a second plurality of NAND coupled memory cells comprising the plurality of second active regions; and
a switch arrangement comprising switches individually selecting the memory cells.

32. The integrated circuit of claim 31, wherein the switch arrangement being formed in the fin structure.

33. An integrated circuit having a memory cell arrangement, comprising:
a plurality of memory cells arranged above one another in a fin structure; and
a switching structure including switching elements, at least some of the switching elements being arranged above one another, each switching element being assigned to a respective memory cell.

34. A memory module, comprising:
a plurality of integrated circuits, wherein at least one integrated circuit of the plurality of integrated circuits comprises a memory cell arrangement, the memory cell arrangement comprising:
a fin structure extending a first direction, the fin structure comprising:
- a first insulating layer;
- a first active region disposed above the first insulating layer;
- a second insulating layer disposed above the first active region; and
- a second active region disposed above the second insulating layer;

a charge storage layer structure adjacent at least one sidewall of the fin structure covering at least a portion of the first active region and at least a portion of the second active region; and a control gate adjacent the charge storage layer.

35. The memory module of claim 34, wherein the memory module is a stackable memory module in which at least some of the integrated circuits are stacked one above the other.

* * * * *